(12) United States Patent
Nakazawa et al.

(10) Patent No.: US 8,247,306 B2
(45) Date of Patent: Aug. 21, 2012

(54) SOLID-STATE IMAGE PICKUP DEVICE AND A METHOD OF MANUFACTURING THE SAME

(75) Inventors: Keiichi Nakazawa, Kumamoto (JP); Takayuki Enomoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 69 days.

(21) Appl. No.: 12/700,967

(22) Filed: Feb. 5, 2010

(65) Prior Publication Data

US 2010/0230773 A1 Sep. 16, 2010

(30) Foreign Application Priority Data

Mar. 11, 2009 (JP) ................................ 2009-057485

(51) Int. Cl.
*H01L 21/76* (2006.01)

(52) U.S. Cl. ............ 438/401; 438/59; 438/70; 438/462; 438/975

(58) Field of Classification Search ............ 257/59, 257/72, 225, 283, 459, 797, E27.131, E27.132, 257/E27.133, E27.135, E27.141, E23.179, 257/31.11, E31.127, E31.097; 438/59, 70, 438/401, 462, 975, FOR. 435
See application file for complete search history.

(56) References Cited

U.S. PATENT DOCUMENTS

| | | | | |
|---|---|---|---|---|
| 2002/0085103 A1* | 7/2002 | Kondo et al. | ................ | 348/273 |
| 2004/0005729 A1* | 1/2004 | Abe et al. | ................ | 438/48 |
| 2005/0151169 A1* | 7/2005 | Miyaguchi | ................ | 257/215 |
| 2005/0264662 A1* | 12/2005 | Suzuki et al. | ................ | 348/294 |
| 2008/0102554 A1* | 5/2008 | Abe et al. | ................ | 438/70 |
| 2008/0108167 A1* | 5/2008 | Abe et al. | ................ | 438/59 |
| 2009/0039454 A1* | 2/2009 | Masuda et al. | ................ | 257/432 |

FOREIGN PATENT DOCUMENTS

JP 2005-150463 6/2005

\* cited by examiner

*Primary Examiner* — N Drew Richards
*Assistant Examiner* — Joannie A Garcia
(74) *Attorney, Agent, or Firm* — Robert J. Depke; Rockey, Depke & Lyons, LLC

(57) ABSTRACT

A solid-state image pickup device includes: a silicon layer; a pixel portion formed in the silicon layer for processing and outputting signal charges obtained by carrying out photoelectric conversion for incident lights; an alignment mark formed in a periphery of the pixel portion and in the silicon layer; and a contact portion through which a first electrode within a wiring layer formed on a first surface of the silicon layer, and a second electrode formed on a second surface opposite to the first surface of the silicon layer through an insulating film are connected, wherein the alignment mark and the contact portion are formed from conductive layers made of the same conductive material and formed within respective holes each extending completely through the silicon layer through respective insulating layers made of the same material.

3 Claims, 24 Drawing Sheets

SOLID-STATE IMAGE PICKUP DEVICE AND A METHOD OF MANUFACTURING THE SAME

The present application claims priority to Japanese Patent Application JP 2009-057485 filed in the Japan Patent Office on Mar. 11, 2009, the entire content of which is hereby incorporated by reference.

BACKGROUND OF THE INVENTION

1. Field of the Invention

The present invention relates to a solid-state image pickup device, and a method of manufacturing the same.

2. Description of the Related Art

An example of a CMOS (Complementary Metal Oxide Semiconductor) type solid-state image pickup element to which a back surface radiation type structure to which a light is made incident from a side opposite to a side having wiring layers formed thereon to be received is applied will now be described with reference to a schematic structural cross sectional view shown in FIG. 24.

As shown in FIG. 24, photodiodes PDs composing light receiving sensor portions of respective pixels are formed in a single-crystalline silicon layer 361. Also, a color filter layer 364 and lenses 365 are provided on an upper side (on a light incidence side) relative to the single-crystalline silicon layer 361. It is noted that as will be described later, the single-crystalline silicon layer 361 is obtained by thinning a silicon substrate (not shown).

On the other hand, multiple wiring layers 363 are provided in an interlayer insulating layer 362 on a lower side (on a side opposite to the light incidence side) relative to the single-crystalline silicon layer 361. Also, the interlayer insulating layer 362 having the multiple wiring layers 363 formed therein is supported by a supporting substrate 366 provided under the interlayer insulating layer 362.

With a method of manufacturing the CMOS type solid-state image pickup element described above, the photodiodes PDs composing the light receiving sensor portions of the respective pixels are formed in the neighborhood of a surface of the silicon substrate (not shown) by carrying out ion implantation. Also, gate electrodes 372 of respective pixel transistors are formed on the silicon substrate through respective gate insulating films (not shown). In addition, the wiring layers 363 are formed in order in the interlayer insulating film 362.

Next, the surface of the uppermost interlayer insulating film 362 is planarized, the silicon substrate described above is reversed, and the supporting substrate 366 is then stuck onto the planarized surface of the uppermost interlayer insulating film 362.

Next, a back surface of the silicon substrate is polished to thin the silicon substrate, thereby forming the single-crystalline silicon layer 361 described above. As a result, the photodiodes PDs are formed inside the silicon substrate (that is, the single-crystalline silicon layer 361). Also, the color filter layer 364 and the lenses 365 are formed in order on the above single-crystalline silicon layer 361 having a predetermined thickness on a planarizing layer (not shown).

In the manner described above, it is possible to manufacture the CMOS type solid-state image pickup element 360 shown in FIG. 24. The CMOS type solid-state image pickup element, for example, is described in Japanese Patent Laid-Open No. 2005-150463 (hereinafter referred to as Patent Document 1) (refer to FIG. 35).

With the manufacturing processes described above, in forming the lenses 365 in the final process, the lenses 365 need to be aligned with the respective photodiodes PDs previously formed. For this reason, the presence of an alignment mark becomes essential for the formation of the lenses 365.

In addition, since the supporting substrate 366 is stuck onto the side of the interlayer insulating film 362, it may be impossible to form pad contacts (not shown) by utilizing a normal method.

For this reason, in forming the photodiodes PDs inside the silicon substrate (the single-crystalline silicon layer 361), a hole (not shown) for the alignment mark is formed so as to extend completely up to the back surface of the silicon substrate, and an insulating layer is filled in the hole, thereby forming the alignment mark (not shown). Thus, in forming the lenses 365, the lenses 365 can be aligned with the respective photodiodes PDs by using the alignment mark.

With the structure described above, however, for extraction of an electrode for formation of the pad, the single-crystalline silicon layer needs to be dug from the light incidence side, thereby forming an opening portion which is opened through an upper portion of the electrode because the electrode is formed on the wiring layer side. This process results in an increase of the number of processes, and an increase of a manufacture cost. In addition, there is the electrode for the pad in a bottom portion of the opening portion. Therefore, an element area increases all the more because the opening portion needs to be widely formed in order to prevent a wiring connected to that electrode from contacting the periphery of the opening portion.

In addition, a structure different from the structure described above is also disclosed. In this case, although not illustrated, for example, a silicon layer is formed on a wiring insulating layer having a wiring formed therein, and a photodiode is formed in the silicon layer. Also, a contact layer is formed so as to extend completely through the silicon layer to reach an upper portion of the wiring insulating layer. An insulating layer is formed in a side periphery of the contact layer so as to be insulated from the silicon layer. Also, a lower portion of the contact layer described above is connected to the wiring in a wiring layer formed in the wiring insulating layer, and an upper portion of the contact layer described above is connected to the pad electrode, thereby structuring a pad portion.

A metal such as tungsten (W) is used as a material for the contact layer described above. In addition to tungsten, aluminum (Al), copper (Cu), silver (Ag), gold (Au), or an alloy thereof can be used as the metal for the contact layer described above.

In addition, an insulating layer made of the same material as that for the insulating layer described above is formed in the silicon layer so as to extend completely through the silicon layer, thereby forming an alignment mark.

With this related art, the insulating layer forming the alignment mark, and the metal forming the contact layer are formed in the different processes, respectively. In addition thereto, after the insulating layer forming the alignment mark is filled in a connection hole forming the contact layer, the insulating layer filled in the connection hole is removed. After that, the metal is filled in the connection hole through a newly formed insulating layer, thereby forming the contact layer. This technique, for example, is described in Patent Document 1 (refer to FIG. 1). To this end, the manufacturing processes are complicated.

SUMMARY OF THE INVENTION

The problems to be solved by the present invention are now described as follows. That is to say, the electrode for the pad is formed in the bottom portion of the opening portion which is formed so as to extend completely through the silicon layer. Therefore, for causing the wiring to be readily connected to the wiring, the opening portion needs to be largely formed. For this reason, the element area becomes large. This is one problem. In addition, when the electrode forming the pad is desired to be formed on the light incidence side, the manufacturing processes are compelled to be complicated because the process for forming the alignment mark, the process for forming the contact portion are not identical to each other. This is the other problem.

The present invention has been made in order to solve the problems described above, and it is therefore desirable to provide a solid-state image pickup device and a method of manufacturing the same in each of which an electrode for a pad can be formed on a so-called back surface side (light incidence side) to reduce an element area, and an alignment mark and a contact portion can be formed in the same process by making structures of the alignment mark and the contact portion identical to each other, thereby simplifying manufacture processes.

In order to attain the desire described above, according to an embodiment of the present invention, there is provided a solid-state image pickup device including: a silicon layer; a pixel portion formed in the silicon layer for processing and outputting signal charges obtained by carrying out photoelectric conversion for incident lights; an alignment mark formed in a periphery of the pixel portion and in the silicon layer; and a contact portion through which a first electrode within a wiring layer formed on a first surface of the silicon layer, and a second electrode formed on a second surface opposite to the first surface of the silicon layer through an insulating film are connected. In the solid-state image pickup device, the alignment mark and the contact portion are formed from conductive layers made of the same conductive material and formed within respective holes each extending completely through the silicon layer through respective insulating layers made of the same material.

In the solid-state image pickup device according to the embodiment of the present invention, it is unnecessary to form an opening which extends completely through the silicon layer in order to expose the electrode for the pad because the second electrode in the pad portion is formed on the second surface side of the silicon layer. In addition, the contact portion which is formed in the position where the existing opening is intended to be formed can be formed with a smaller occupation area than that of the existing opening because all it takes is that the electrical connection between the first electrode and the second electrode in the pad portion is obtained. Also, the alignment mark and the contact portion formed from the respective conductive layers made of the same conductive material are formed within the holes forming the alignment mark and the contact portion, respectively, through respective insulating layers made of the same material. Therefore, the solid-state image pickup device has the structure with which the alignment mark and the contact portion can be formed in the same process.

According to another embodiment of the present invention, there is provided a method of manufacturing a solid-state image pickup device including the steps of: forming a first hole in which an alignment mark is intended to be formed, and a second hole in which a contact portion for a pad is intended to be formed from a first surface side of a silicon substrate; filling a conductive layer in each of the first hole and the second hole through an insulating layer, thereby forming the alignment mark and the contact portion in the first hole and the second hole, respectively; and forming a light receiving portion, in a pixel portion, for photoelectrically converting an incident light to output signal charges corresponding to the incident light, a transistor, in the pixel portion, for reading out the signal charges from the light receiving portion and outputting a signal corresponding to the signal charges, and a transistor, in a peripheral circuit portion, for processing the signal outputted from the pixel portion in the silicon substrate. The method further includes the steps of: forming a first insulating film on the first surface of the silicon substrate, and forming a connection electrode so as to be connected to the contact portion on the first insulating film; forming a wiring layer so as to include a first electrode, in a pad portion, connected to the connection electrode on the first insulating film; removing a second surface side opposite to the first surface side of the silicon substrate until the contact portion is exposed, and forming a second insulating film on an exposed surface of the remaining silicon substrate; and forming a second electrode, in the pad portion, so as to be connected to the conductive layer in the second insulating film on the second surface side of the silicon substrate.

In the method of manufacturing a solid-state image pickup device according to the another embodiment of the present invention, it is unnecessary to form an opening which extends completely through the silicon layer in order to expose the electrode for the pad because the second electrode in the pad portion is formed on the second surface side of the silicon layer. In addition, the contact portion which is formed in the position where the existing opening is intended to be formed can be formed with a smaller occupation area than that of the existing opening because all it takes is that the electrical connection between the first electrode and the second electrode in the pad portion is obtained. Also, the alignment mark and the contact portion formed from the respective conductive layers made of the same conductive material are formed within the respective holes for formation of the alignment mark and the contact portion, and in the same step. Therefore, the step of forming the alignment mark and the step of forming the contact portion are simplified.

The solid-state image pickup device of the present invention has an advantage that it is possible to reduce the element area because it is unnecessary to form the opening portion for extraction of the electrode for the pad since the second electrode is formed on the second surface side of the silicon layer. In addition, the manufacture processes can be simplified because the solid-state image pickup device has the structure that it is unnecessary to form the opening portion for extraction of the electrode for the pad.

The method of manufacturing a solid-state image pickup device of the present invention has an advantage that the manufacture processes can be simplified and the manufacturing cost can be reduced so as to be associated therewith because the number of processes can be reduced since the alignment mark and the contact portion can be formed in the same process.

DETAILED DESCRIPTION OF THE PREFERRED EMBODIMENTS

The preferred embodiments of the present invention will be described in detail hereinafter with reference to the accompanying drawings.

1. First Embodiment

A solid-state image pickup device according to a first embodiment of the present invention will now be described in detail with reference to a schematic structural cross sectional view shown in FIG. 1.

Figure 1:
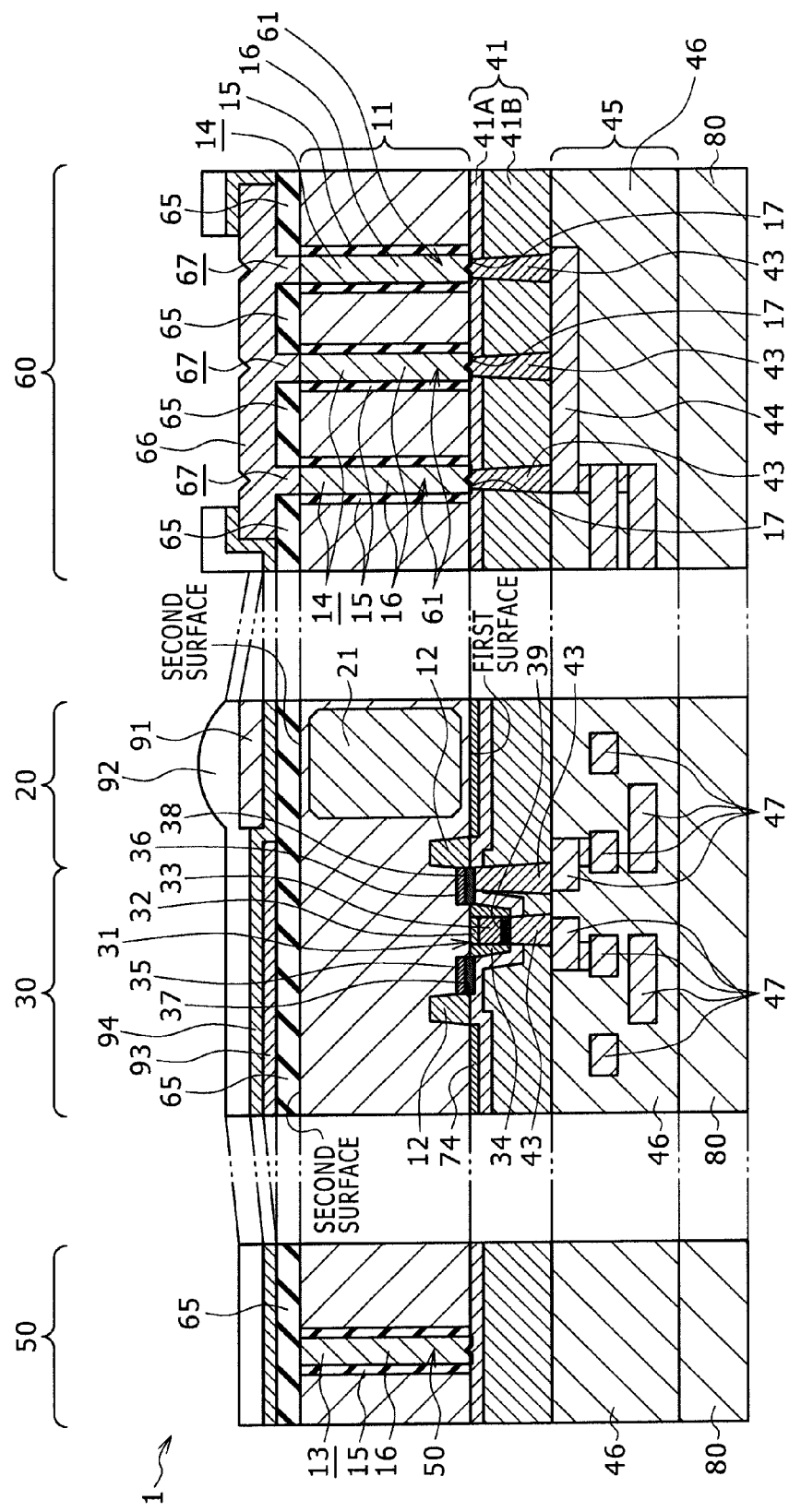
FIG. 1 is a schematic cross sectional view showing a structure of a solid-state image pickup device according to a first embodiment of the present invention.

As shown in FIG. 1, a pixel portion 20 and an isolation region 12 are formed in a silicon layer 11. Here, the pixel portion 20 photoelectrically converts an incident light into signal charges and outputs the resulting signal charges. The isolation region 12 isolates a peripheral circuit portion 30 for processing the signal charges outputted from the pixel portion 20. The isolation region 12, for example, is formed so as to have a Shallow Trench Isolation (STI) structure. It is noted that diffusion layer separation can also be used for separation of a light receiving portion 21 and a pixel transistor portion (not shown) within the pixel portion 20.

The light receiving portion 21 for photoelectrically converts the incident light is formed in the silicon layer 11 described above. Also, the pixel transistor portion (not shown) for outputting the signal charges obtained through the photoelectric conversion in the light receiving portion 21 is formed in the silicon layer 11 described above. In addition, a transistor 31 in a peripheral circuit portion 30 is formed in the periphery of the pixel portion 20 having the light receiving portion 21 and the pixel transistor portion.

The light receiving portion 21, for example, is composed of a photodiode, and thus, for example, is composed of an N-type region and a P⁺-type region which, for example, is formed on a light incidence side of the N-type region.

Although not illustrated, transistors of the pixel transistor portion described above normally have a four-transistor configuration of a transfer transistor, a reset transistor, an amplification transistor, and a selection transistor. Or, the transistors of the pixel transistor portion have a three-transistor configuration.

In addition, for example, a pixel transistor group consisting of the reset transistor, the amplification transistor and the selection transistor may be pixel transistors common to two light receiving portions. Or, the pixel transistor group described above may be pixel transistors common to four light receiving portions.

The transfer transistor described above is connected between a cathode electrode of the photodiode of the light receiving portion 21, and a floating diffusion portion as a charge-voltage converting portion. Also, the transfer transistor described above transfers the signal charges (the electrons in this case) obtained through the photoelectric conversion in the light receiving portion 21 and accumulated therein to the floating diffusion portion in accordance with a transfer pulse applied to a gate electrode (control electrode) thereof.

The reset transistor described above is connected in a drain electrode thereof to a reset line, and is connected in a source electrode thereof to the floating diffusion portion. Also, prior to the transfer of the signal charges from the light receiving portion 21 to the floating diffusion portion, a potential of the floating diffusion portion is reset at a reset voltage by applying a reset pulse to a gate electrode of the reset transistor described above.

The amplification transistor described above is connected in a gate electrode thereof to the floating diffusion portion, and is connected in a drain electrode thereof to a pixel power source. Also, the amplification transistor described above outputs a potential of the floating diffusion portion after being reset by the reset transistor in the form of a reset level. In addition, the amplification transistor described above outputs a potential of the floating diffusion portion after the signal charges are transferred to the floating diffusion portion by the transfer transistor in the form of a signal level.

The selection transistor described above, for example, is connected in a drain electrode thereof to a source electrode of the amplification transistor, and is connected in a source electrode thereof to an output signal line. Also, the selection transistor described above is turned ON by applying a selection pulse to a gate electrode thereof to make the pixel in a selection state, thereby outputting a signal outputted from the amplification transistor to the output signal line.

The transistors in the peripheral circuit 30, for example, are composed of a plurality of MOS transistors such as a PMOS transistor and an NMOS transistor. In FIG. 1, one transistor 31 is shown on behalf of a plurality of MOS transistors.

For example, gate insulating films 32 of the PMOS transistor and the NMOS transistor are formed on a first surface of the silicon layer 11, and gate electrodes 33 of the PMOS transistor and the NMOS transistor are formed on the gate insulating films 32, respectively. Each of the gate electrodes 33, for example, is made of polysilicon.

In addition, when the gate electrode 33 is made of polysilicon, the gate electrode 33 of the NMOS transistor is doped with an n-type impurity. For example, the gate electrode 33 of the NMOS transistor is doped with either phosphorus (P) or arsenic (As) with a dosage of about $1 \times 10^{15}$ to about $1 \times 10^{16}$/cm$^2$.

The gate electrode 33 of the PMOS transistor is doped with a p-type impurity. For example, the gate electrode 33 of the PMOS transistor is doped with any one of boron (B), boron difluoride (BF$_2$) or indium (In) with a dosage of about $1 \times 10^{15}$ to about $1 \times 10^{16}$/cm$^2$.

Source and drain regions 35 and 36 are formed in the silicon layer 11 on both sides of each of the gate electrodes 33 of the NMOS transistor and the PMOS transistor through LDD regions (not shown), respectively. In addition, although not illustrated, the floating diffusion portion is also formed in the silicon layer 11.

In addition, silicide layers 37, 38 and 39 are formed on upper surfaces of the source and drain regions 35 and 36, and on an upper surface of the gate electrode 33, respectively. Each of the silicide layers 37, 38 and 39, for example, is made of cobalt silicide (CoSi$_2$), nickel silicide (NiSi), titanium silicide (TiSi$_2$), platinum silicide (PtSi), tungsten silicide (WSi$_2$) or the like.

In addition, a sidewall 34 is formed on each of sidewalls of the gate electrode 33 in the peripheral circuit portion 30. The sidewall 34, for example, is formed so as to have either a two-layer structure having a silicon oxide film and a silicon nitride film, or a three-layer structure having a silicon oxide film, a silicon nitride film and a silicon oxide film. It is noted that a sidewall is formed on each of sidewalls of gate electrodes (not shown) in the pixel transistor portion. In addition, a sidewall formation film 74 used in forming the sidewall 34 is left on each of the light receiving portion 21 and the floating diffusion portion (not shown). The sidewall formation film 74 has a function as a silicide blocking film for preventing the silicidization of the light receiving portion 21, the floating diffusion portion and the like.

The pixel transistor portion composed of the transfer transistor, the reset transistor, the amplification transistor, the selection transistor, and the like is formed in the pixel portion 20 in such a manner. In addition, the transistors (the NMOS transistor and the PMOS transistor) 31 is formed in the peripheral circuit portion 30.

In addition, the alignment mark 50 and the contact portion 61 are formed in the periphery of the pixel portion 20 in the silicon layer 11 described above so as to extend completely through the silicon layer 11.

The alignment mark 50 is composed of a conductive layer 16 which is formed inside a first hole 13, formed so as to extend completely through the silicon layer 11, through an insulating layer 15. In addition, the contact portion 61 is composed of a conductive layer 16 which is formed inside a second hole 14, formed so as to extend completely through the silicon layer 11, through the insulating layer 15. That is to say, the insulating layer 15 of the alignment mark 50, and the insulating layer 15 of the contact portion 61 are the insulating layers made of the same material. In addition, the conductive layer 16 of the alignment mark 50, and the conductive layer 16 of the contact portion 61 are the conductive layers made of the same material. Therefore, the insulating layer 15 of the alignment mark 50, and the insulating layer 15 of the contact portion 61 can be made from the same material layer. In addition, the conductive layer 16 of the alignment mark 50, and the conductive layer 16 made of the contact portion 61 can be made from the same material layer.

The insulating layer 15, for example, is made of a silicon oxide film, a silicon nitride film or the like. In addition, the conductive layer 16 is made from either a polycrystalline silicon (polysilicon) film or an amorphous silicon film which is doped with an impurity having a conductivity type (such as boron (B), phosphorus (P), arsenic (As), or indium (In)).

Silicide layers 17 are formed on the surfaces on the lower portion side, in FIG. 1, of the conductive layers 16 in the contact portion 61, respectively. Each of the silicide layer 17, for example, is made of cobalt silicide (CoSi$_2$), nickel silicide (NiSi), titanium silicide (TiSi$_2$), platinum silicide (PtSi), tungsten silicide (WSi$_2$) or the like.

The silicide layers 17 are formed on the surfaces of the conductive layers 16 in the contact portions 61, respectively, thereby reducing a contact resistance between the contact portions 61 and a first electrode 44 (each of connection electrodes 43 connected to the first electrode 44 in this case) formed in a wiring layer 45 which will be described later.

A first insulating film 41 (composed of a lower layer 41A of the first insulating film 41, and an upper layer 41B of the first insulating film 41) is formed on a first surface (a lower side surface in FIG. 1) on a side opposite to the light incidence side of the silicon layer 11. Also, connection electrodes 43 are formed in the first insulating film 41 so as to be connected to the contact portions 61, respectively.

The wiring layer 45 including the first electrode 44 in the pad portion 60 is formed on a surface (a lower side surface in FIG. 1) of the first insulating film 41 so that the first electrode 44 is connected to each of the connection electrode 43. In the wiring layer 45, a plurality of wirings 47 (including the first electrode 44) are formed within the interlayer insulating film 46.

A surface of the wiring layer 45 (the interlayer insulating film 46) is planarized and a supporting substrate 80 is stuck onto the planarized surface of the wiring layer 45.

A second insulating film 65 is formed on a second surface (an upper surface in FIG. 1) of the silicon layer 11. A second electrode 66 in the pad portion 60 is formed so as to be connected to the exposed surface of the conductive layer 16 through an opening portion 67 formed in the second insulating film 65.

In addition, a color filter layer 91 is formed on an optical path of an incident light made incident to the light receiving portion 21 and on the second insulating film 65.

Moreover, a condenser lens 92 for guiding the incident light to the light receiving portion 21 is formed on the color filter layer 91.

Also, as shown in FIG. 1, a light blocking film 93 may be formed on the peripheral circuit portion 30. In this case, an insulating film 94 is formed so as to cover the light blocking film 93, and the color filter layer 91 is formed on the insulating film 94.

The solid-state image pickup device 1 is structured in the manner as described above.

In the solid-state image pickup device 1, it is unnecessary to form an opening portion extending completely through the silicon layer 11 in order to expose the first electrode 44 for the pad because the second electrode 66 in the pad portion 60 is formed on the second surface side (light incidence side) of the silicon layer 11. In addition, the contact portion 61 formed in the position where an existing opening portion is intended to be formed can be formed with a smaller occupation area than that of the existing opening portion because all it takes is that the electrical connection between the first electrode 44 and the second electrode 66 in the pad portion 60 is obtained. In addition, the alignment mark 50 and the contact portion 61 are formed from the respective conductive layers 16 made of the same conductive material and within the holes for formation of the alignment mark 50 and the contact portion 61 through the insulating layers 15 made of the same material, respectively. As a result, the solid-state image pickup device 1 has the structure allowing the alignment mark 50 and the contact portion 61 to be formed in the same process. As a result, the manufacturing processes can be simplified.

Change of First Embodiment

Next, a structure of a solid-state image pickup device according to a change of the first embodiment of the present invention will be described.

The solid-state image pickup device of the change of the first embodiment is such that in the solid-state image pickup device 1 of the first embodiment described with reference to FIG. 1, the silicide layer is not formed, but each of the conductive layers 16 is made of a metal. Copper (Cu), aluminum (Al), tungsten (W), titanium (Ti), tantalum (Ta) or the like, for example, can be used as this metal. In addition, an alloy thereof can also be used as this metal. It should be noted that the constituent elements other than the silicide layer and the conductive layers 16 are identical to those in the solid-state image pickup device 1 of the first embodiment.

Each of the conductive layers 16 is made of the metal in such a manner, thereby making it possible to further reduce the contact resistance between the first electrode 44 (substantially, each of the connection electrodes 43) and each of the conductive layers 16.

2. Second Embodiment

A method of manufacturing a solid-state image pickup device according to a second embodiment of the present invention will be described in detail hereinafter with reference to schematic cross sectional views explaining respective manufacture processes shown in FIGS. 2 to 11. It is noted that a standpoint in FIGS. 2 to 8 is reverse to that in FIG. 1.

Figure 2:
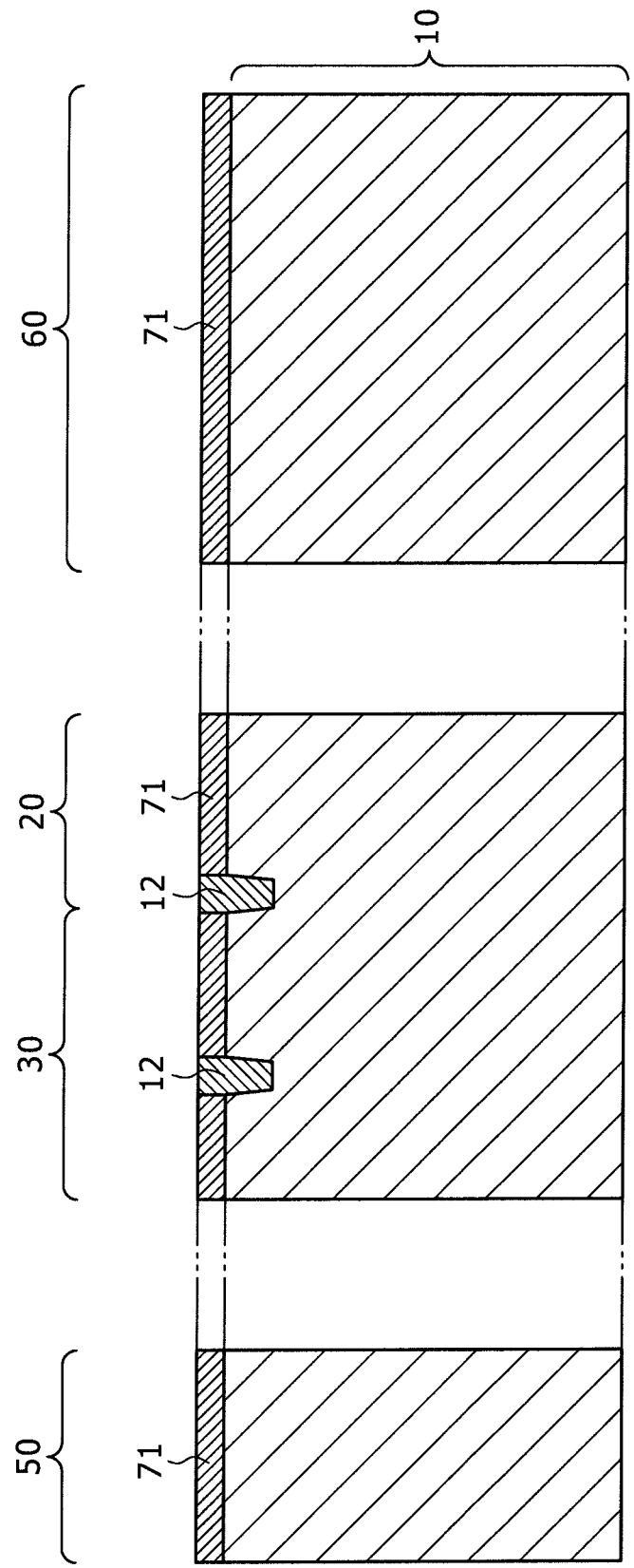
FIG. 2 is a schematic cross sectional view showing a process in a method of manufacturing the solid-state image pickup device shown in FIG. 1 according to a second embodiment of the present invention.

As shown in FIG. 2, the isolation region 12 through which the pixel portion 20 for photoelectrically converting the incident light and outputting the signal charges corresponding to the incident light, and the region for formation of the peripheral circuit portion 30 for processing the signal charges thus outputted are isolated from each other is formed in the silicon substrate 10. For formation of the isolation region 12, firstly, a silicon nitride film 71 is formed on the first surface (surface) of the silicon substrate 10 through a silicon oxide film (not shown).

Next, a resist film (not shown) is formed on the silicon nitride film 71 by utilizing a normal resist application technique. Subsequently, the resist film is patterned by utilizing a normal lithography technique to form a resist pattern (not shown) having an opening portion on a region in which the isolation region 12 is intended to be formed. After the silicon nitride film 71 and the silicon oxide film are selectively etched away in order by using the resist pattern as an etching mask to form an opening portion, the resist pattern is removed.

Next, an isolation trench in which the isolation region 12 is intended to be formed is formed in the silicon substrate 10 by using the silicon nitride film 71 described above as an etching mask. After that, an insulating film is filled in the isolation trench, and the excessive insulating film lying on the silicon nitride film 71 described above by, for example, utilizing a chemical mechanical polishing (CMP) method. It should be noted that an inner surface of the isolation trench may be oxidized before the insulating film is filled in the isolation trench, thereby forming an oxide film.

After that, the silicon nitride film 71 described above is removed by, for example, utilizing a wet etching method using a hot phosphoric acid. FIG. 2 shows a state right before the silicon nitride film 71 is removed.

Figure 3:
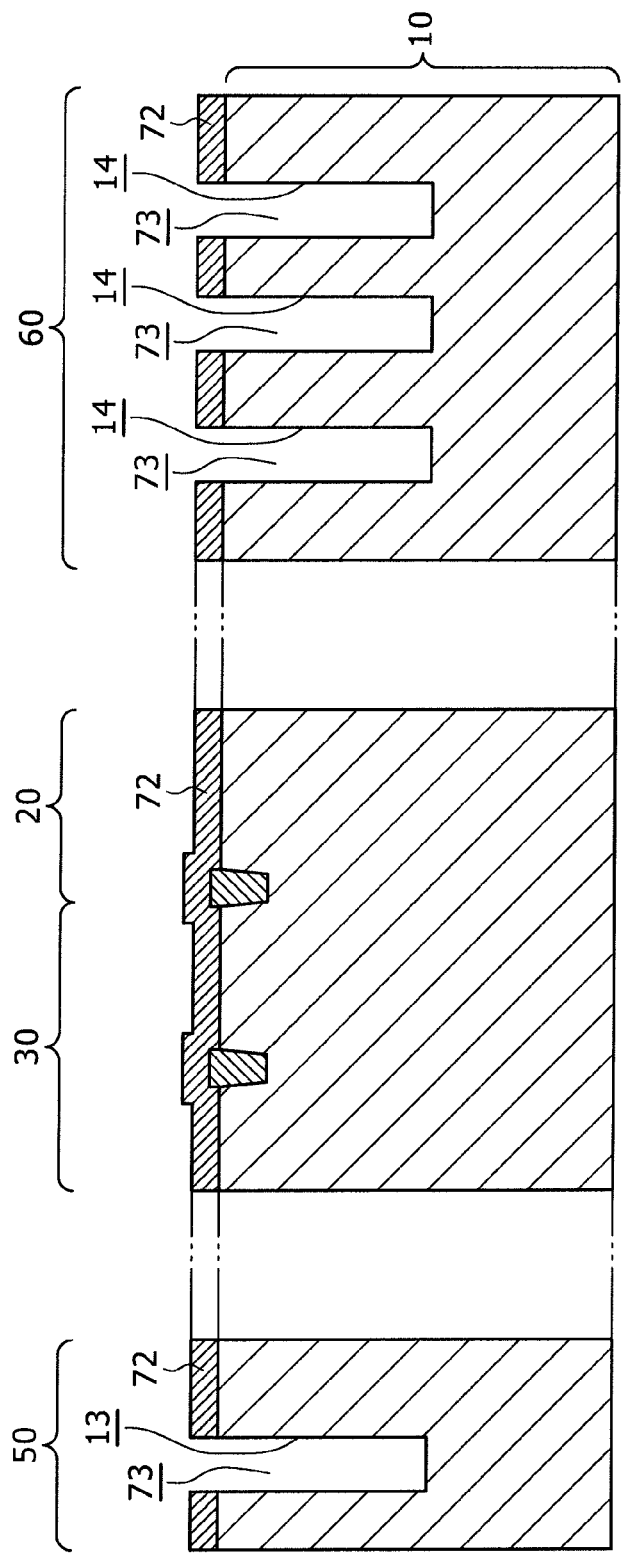
FIG. 3 is a schematic cross sectional view showing a process in the method of manufacturing the solid-state image pickup device shown in FIG. 1 according to the second embodiment of the present invention.

Next, as shown in FIG. 3, a silicon nitride film 72 is formed on the silicon substrate 10. A resist film (not shown) is formed on the silicon nitride film 72 by utilizing the normal resist application technique similarly to the above case. Subsequently, the resist film is patterned by utilizing the normal lithography technique to form a resist pattern (not shown). In the resulting resist pattern, opening portions are formed on a region in which the alignment mark 50 is intended to be formed, and on regions in which the contact portions 61 are intended to be formed so as to be connected to the electrodes in the pad portion 60, respectively. The silicon nitride film 72 and the silicon oxide film are selectively etched away by using the resist pattern as an etching mask to form opening portions 73. Also, the resist pattern is then removed.

In addition, the first hole 13 in which the alignment mark 50 is intended to be formed, and the second holes 14 in which the contact portions 61 in the pad portion 60 are intended to be formed, respectively, are formed in the silicon substrate 10 by using the silicon nitride film 72 having the opening portions 73 formed therein as an etching mask.

The region in which the alignment mark 50 is intended to be formed, and the regions in which the contact portions 61 are intended to be formed so as to be connected to the electrodes in the pad portion 60, respectively, for example, are located in a peripheral portion of the area in which the pixel portion 20 is intended to be formed. In addition, each of the second holes 14 is formed to have a depth (of about 1 to about 5 μm) corresponding to a thickness of the silicon layer 11 when the silicon substrate 10 is thinned in the later process to form the silicon layer 11. Thus, each of the second holes 14 is formed to have such a depth, whereby each of the second holes 14 is formed so as to extend completely through the silicon layer 11. It is noted that a diameter of each of the second holes 14 is preferably larger as long as the conductive layer can be filled in each of the second holes 14 because the diameter of each of the second holes 14 exerts an influence on the resistance value. For example, the diameter of each of the second holes 14 is preferably about 1 μm.

Figure 4:
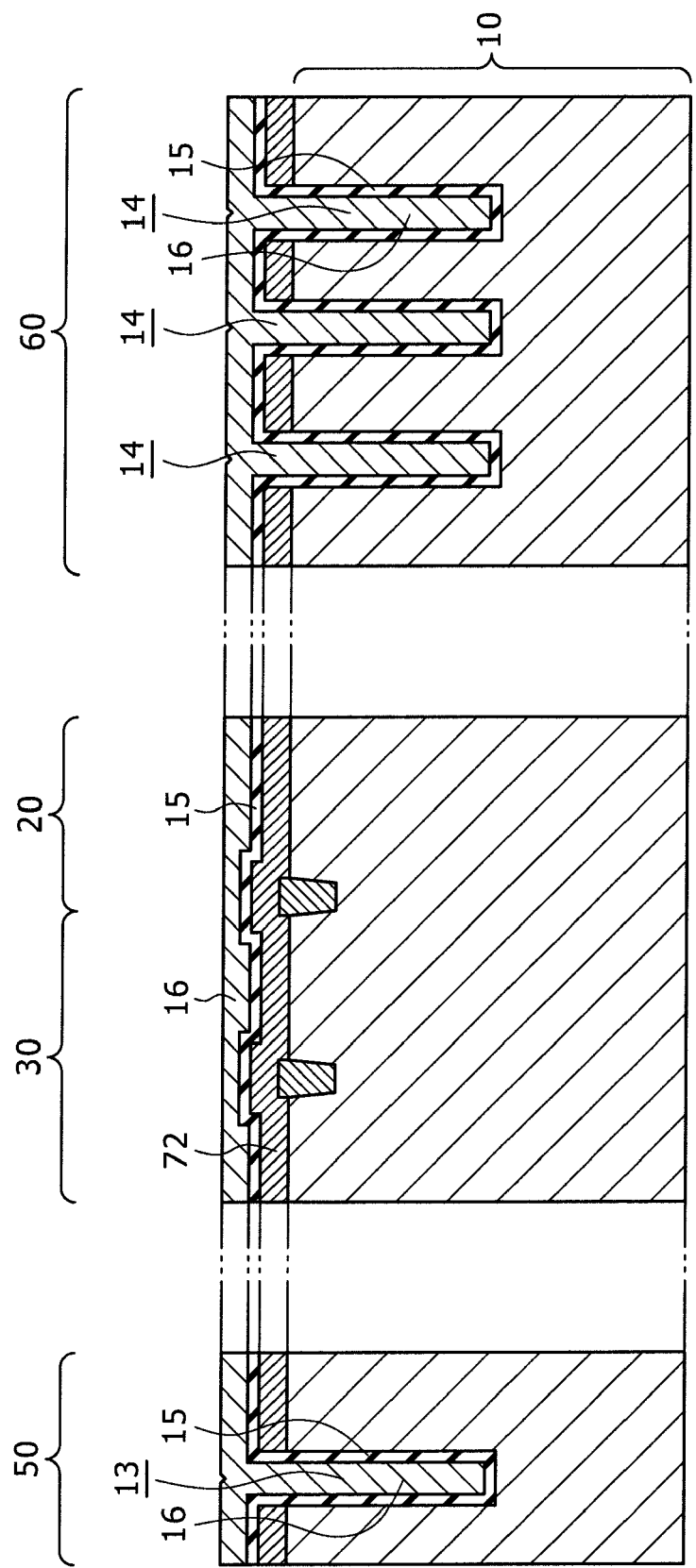
FIG. 4 is a schematic cross sectional view showing a process in the method of manufacturing the solid-state image pickup device shown in FIG. 1 according to the second embodiment of the present invention.

Next, as shown in FIG. 4, the conductive layers 16 are filled in the first hole 13 and each of the second holes 14 through the insulating layers 15, respectively. At this time, the insulating layer 15 and the conductive layer 16 are formed on the silicon nitride film 72 as well.

The insulating layer 15, for example, is formed to have a thickness equal to or larger than a thickness with which the insulating property with the silicon substrate 10 can be ensured so as not to be filled in each of the second holes 14. For example, the insulating layer 15 is formed to have the thickness of 100 to 500 nm. However, in the case where the diameter of each of the second holes 14 is set as 1 μm, when the thickness of the insulating layer 15 is 500 nm, each of the second holes 14 is perfectly filled with the insulating layer 15. From this viewpoint, preferably, the thickness of the insulating layer 15 is set in the range of 100 to 200 nm so that a room of the filling of the conductive layer 16 is left. As has been described, it is important that the insulating layer 15 is formed to have the thickness equal to or larger than the thickness with which the insulating property with the silicon substrate 10 can be ensured, and the room of the filling of the conductive layer 16 is left.

The insulating layer 15, for example, is made from the silicon oxide film, a silicon nitride film or the like. In addition, the conductive layer 16 is made from either a polycrystalline silicon (polysilicon) film or an amorphous silicon film which is doped with an impurity having a conductivity type (such as boron (B), phosphorus (P), arsenic (As), or indium (In)).

In addition, each of the insulating layer 15 and the conductive layer 16 is formed by, for example, utilizing a Chemical Vapor Deposition (CVD) method because each of the insulating layer 15 and the conductive layer 16 is preferably formed to have a uniform thickness.

Figure 5:
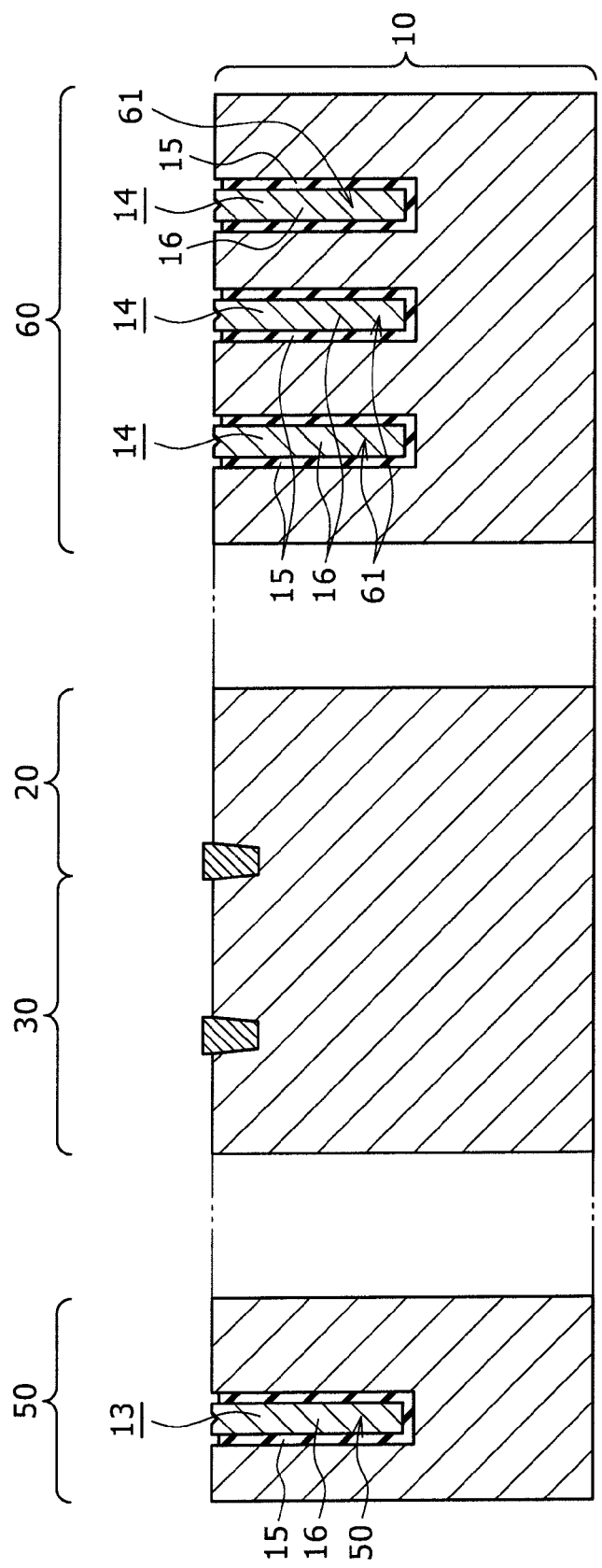
FIG. 5 is a schematic cross sectional view showing a process in the method of manufacturing the solid-state image pickup device shown in FIG. 1 according to the second embodiment of the present invention.

Next, as shown in FIG. 5, the excessive conductive layer 16 and insulating layer 15 lying on the silicon substrate 10 are removed away. As a result, the alignment mark 50 is formed which is obtained by filling the conductive layer 16 in the first hole 13 through the insulating layer 15. At the same time, the contact portions 61 are formed which are obtained by filling the conductive layers 16 in the second holes 14 through the insulating layers 15, respectively.

It is noted that the excessive conductive layer 16 and insulating layer 15 lying on the silicon substrate 10 are removed away by carrying out etch back. Of course, the excessive conductive layer 16 and insulating layer 15 lying on the silicon substrate 10 may be removed away by utilizing the CMP method.

It should be noted that it is no problem that stepped portions are caused in the alignment mark 50, and the contact portions 61 relative to the surface of the silicon substrate 10.

Figure 6:
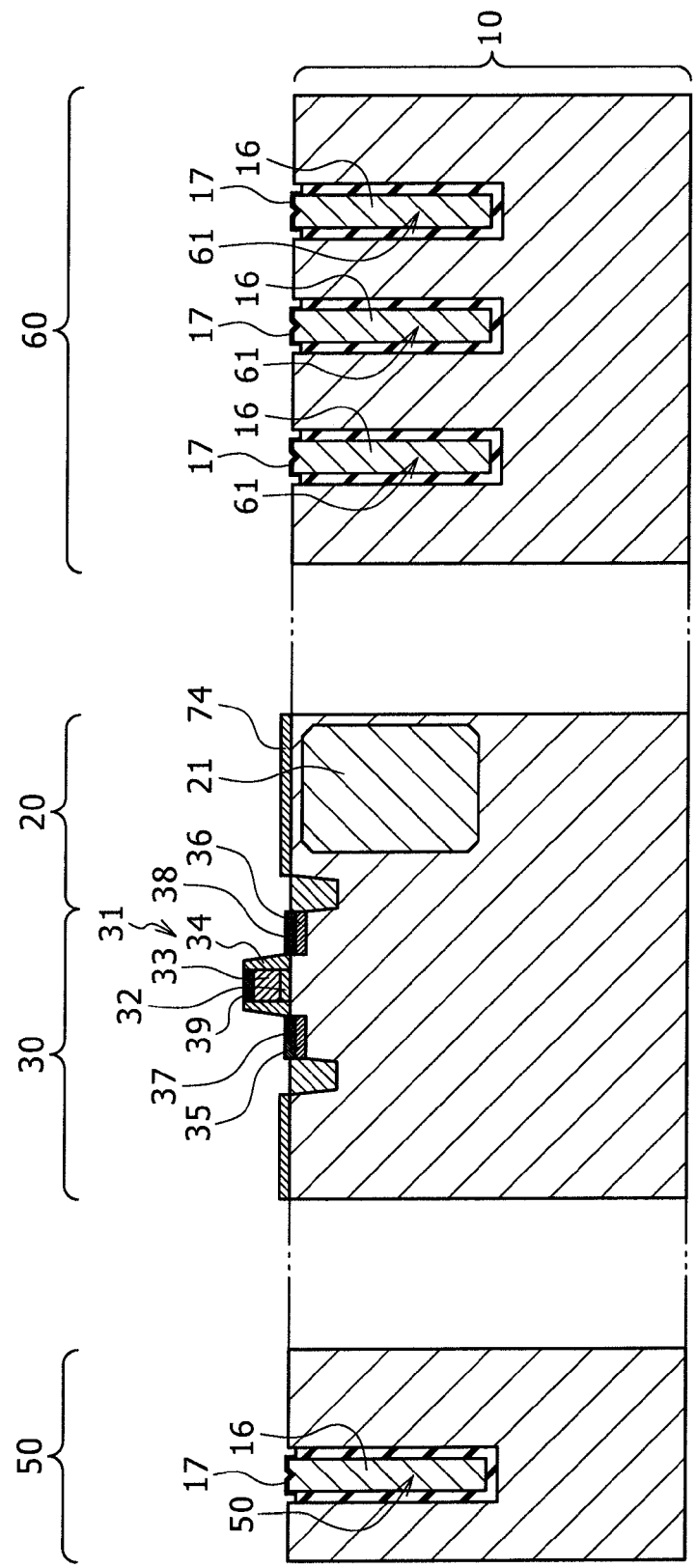
FIG. 6 is a schematic cross sectional view showing a process in the method of manufacturing the solid-state image pickup device shown in FIG. 1 according to the second embodiment of the present invention.

Next, as shown in FIG. 6, the light receiving portion 21 for photoelectrically converting the incident light into the signal charges is formed in the silicon substrate 10. In addition, the pixel transistor portion (not shown) for outputting the signal charges obtained through the photoelectric conversion in the light receiving portion 21 is formed in the silicon substrate 10. Moreover, the transistor 31 in the peripheral circuit portion 30 is formed in the periphery of the pixel portion 20 having the light receiving portion 21 and the pixel transistor portion described above formed therein.

The light receiving portion 21, for example, is composed of the photodiode, and, for example, is formed from the N-type region and a $P^+$-type region which is, for example, formed on the light incidence side of the N-type region.

The transistors (not shown) in the pixel transistor portion normally have the four-transistor configuration of the transfer transistor, the reset transistor, the amplification transistor, and the selection transistor. Or, the transistors of the pixel transistor portion have the three-transistor configuration.

In addition, for example, the pixel transistor group consisting of the reset transistor, the amplification transistor and the selection transistor may be pixel transistors common to the two light receiving portions. Or, the pixel transistor group described above may be pixel transistors common to the four light receiving portions.

The transistors 31 of the peripheral circuit 30, for example, are composed of a plurality of MOS transistors such as the PMOS transistor and the NMOS transistor. In FIG. 6, one transistor 31 is shown on behalf of a plurality of MOS transistors.

For example, the gate insulating films 32 of the PMOS transistor and the NMOS transistor are formed on the silicon substrate 10. Next, the gate electrodes 33 are formed in the gate insulating films 32, respectively. The gate electrodes 33 are formed by depositing polysilicon by, for example, utilizing a Low Pressure-Chemical Vapor Deposition (LP-CVD) method.

In addition, when each of the gate electrodes 33 is made of polysilicon, the measures to cope with gate depletion are taken for a film (gate electrode formation film) from which each of the gate electrodes 33 is intended to be formed before the film concerned is patterned into the gate electrodes 33. The gate depletion is a problem that an influence of not only the physical thickness of the gate insulating film, but also the thickness of the depletion layer within the gate polysilicon cannot be ignored along with the thinning of the thickness of the gate insulating film, and thus the effective thickness of the gate insulating film does not become thin, thereby degrading the transistor performance.

For example, the gate electrode formation film in the region in which the NMOS transistor is intended to be formed is doped with an n-type impurity. For example, either phosphorus (P) or arsenic (As) ions are implanted into the gate electrode formation film in the region in which the NMOS transistor is intended to be formed with a dosage of about $1\times10^{15}$ to about $1\times10^{16}/cm^2$.

Next, the gate electrode formation film in the region in which the PMOS transistor is intended to be formed is doped with a p-type impurity. For example, any of boron (B), boron difluoride ($BF_2$) or indium (In) ions are implanted into the gate electrode formation film in the region in which the NMOS transistor is intended to be formed with a dosage of about $1\times10^{15}$ to about $1\times10^{16}/cm^2$.

Any of the ion implantations described above may be firstly carried out. In addition, in each of the later ion implantations as well as each of the ion implantations described above, the ion implantation is carried out in a state in which an ion implantation mask is suitably formed similarly to the general ion implantation. Also, the resist for the ion implantation mask is removed away after completion of the ion implantation.

Next, LDD regions (not shown) of the respective MOS transistors are formed.

Firstly, with regard to the NMOS transistor formed in the peripheral circuit portion 30, the LDD regions (not shown)

are formed in the semiconductor substrate 10 on both sides of each of the gate electrode 33, respectively. Each of the LDD regions is formed by carrying out the ion implantation. Either arsenic (As) or phosphorus (P) is used as an ion implantation seed, and a dosage is, for example, set in the range of $1\times10^{13}$ to $1\times10^{15}/cm^{2}$. At this time, with regard to the MOS transistor as well formed in the pixel transistor portion concurrently therewith, the LDD regions may be formed in the semiconductor substrate 10 on the both sides of each of the gate electrodes 23, respectively. In addition, a pocket diffusion layer may be formed prior to the formation of those LDD regions.

With regard to the region in which the PMOS transistor is intended to be formed in the peripheral circuit portion 30, LDD regions (not shown) are formed in the semiconductor substrate 10 on both sides of each of the gate electrodes 33, respectively. Any of boron difluoride ($BF_2$), boron (B) or indium (In) is used as an ion implantation seed, and a dosage is, for example, set in the range of $1\times10^{13}$ to $1\times10^{15}/cm^{2}$. In addition, a pocket diffusion layer may be formed prior to the formation of those LDD regions.

Next, the sidewall 34 is formed on each of the sidewalls of the gate electrodes 33 in the peripheral circuit portion 30. In FIG. 6, one transistor 31 is shown on behalf of a plurality of MOS transistor.

After a sidewall formation film is deposited over the entire surface of the silicon substrate 10, etch back is carried out for the sidewall formation film, thereby forming the sidewall 34. The sidewall 34, for example, is formed so as to have either the two-layer structure having the silicon oxide film and the silicon nitride film, or the three-layer structure having the silicon oxide film, the silicon nitride film and a silicon oxide film. It is noted that at the same time, the sidewall is formed on each of the sidewalls of the gate electrodes in the pixel transistor portion. At this time, the sidewall formation film 74 may be left both on the light receiving portion 21 and on the region in which the floating diffusion portion (not shown) is intended to be formed, and may be used as the silicide blocking film in forming the silicide layer in the later processes. As a result, it is possible to suppress generation of white defects and random noises.

Next, the source and drain regions 35 and 36 are formed in each of the regions in which the MOS transistors are intended to be formed, respectively, in the peripheral circuit portion 30. In FIG. 6, one transistor 31 is shown on behalf of a plurality of MOS transistor.

Firstly, for example, the source and drain regions 35 and 36 are formed in the region in which the MOS transistor is intended to be formed in the peripheral circuit portion 30. That is to say, the source and drain regions 35 and 36 are formed in the semiconductor substrate 10 on the both sides of each of the gate electrodes 33 of the NMOS transistors through the LDD regions, respectively. The source and drain regions 35 and 36 are formed by carrying out the ion implantation. Either arsenic (As) or phosphorus (P) is used as an ion implantation seed, and a dosage is, for example, set in the range of $1\times10^{15}$ to about $1\times10^{16}/cm^{2}$. At this time, with regard to the MOS transistor as well formed in the pixel transistor portion concurrently therewith, the source and drain regions may be formed in the semiconductor substrate 10 on the both sides of each of the gate electrodes, respectively. In addition, the floating diffusion portion may also be formed concurrently with the formation of the source and drain regions.

The source and drain regions 35 and 36 are formed in each of the regions in which the PMOS transistors are intended to be formed, respectively, in the peripheral circuit portion 30. That is to say, the source and drain regions 35 and 36 are formed in the semiconductor substrate 10 on the both sides of each of the gate electrodes 33 of the PMOS transistors through the LDD regions, respectively. The source and drain regions 35 and 36 are formed by carrying out the ion implantation. Either boron (B) or boron difluoride ($BF_2$) is used as the ion implantation seed, and a dosage, for example, is set in the $1\times10^{15}$ to $1\times10^{16}/cm^{2}$.

Next, activation annealing is carried out for each of the source and drain regions 35 and 36. This activation annealing, for example, is carried out at about 800 to about 1,000° C. A Rapid Thermal Annealing (RTA) system, a spike-RTA system or the like, for example, can be used as a system for carrying out the activation annealing.

Next, a second silicide blocking film (not shown) is formed so as to cover the pixel transistor portion.

As a result, the light receiving portion 21 on which the sidewall formation film (first silicide blocking film) 74 is left, the floating diffusion portion (not shown), and the pixel transistor portion (not shown) are each covered with the first and second silicide blocking films.

Next, the silicide layers 37, 38 and 39 are formed on the source and drain regions 35 and 36, and the gate electrode 37 of each of the MOS transistors in the peripheral circuit portion 30, respectively. In FIG. 6, one transistor 31 is shown on behalf of a plurality of MOS transistor. At the same time, the silicide layer 17 is formed on each of the surfaces of the conductive layers 16 of the contact portions 61. At this time, the silicide layer 17 is also formed on the conductive layer 16 of the alignment mark 50.

Each of the silicide layers 37, 38, 39, and 17 is made of, for example, cobalt silicide ($CoSi_2$), nickel silicide (NiSi), titanium silicide ($TiSi_2$), platinum silicide (PtSi), tungsten silicide ($WSi_2$) or the like.

The case of formation of nickel silicide will be described below as an example of formation of each of the silicide layers 37, 38, 39, and 17.

Firstly, a nickel (Ni) film is formed over the entire surface of the silicon substrate 10. The nickel film, for example, is formed to have a thickness of 10 nm by, for example, using a sputtering system. Next, annealing processing is carried out at about 300 to about 400° C. to cause nickel of the nickel film to react with silicon as the base, thereby forming a nickel silicide layer. After that, nickel unreacted with silicon is removed away by carrying out wet etching. By carrying out the wet etching, the silicide layers 37, 38, 39, and 17 are selectively formed only on the silicide polysilicon surface other than the insulating film in a self-aligned manner.

After that, the annealing processing is carried out again at about 500 to about 600° C. to stabilize the nickel silicide layer.

In the silicidization process described above, the silicide layer is formed on none of the source and drain regions (not shown) and the gate electrodes (not shown) of the MOS transistors in the pixel transistor portion. The reason for this is because the increases of the white defects and the dark current due to diffusion of the metal in the silicide up to the light receiving portion 21 are eliminated.

The silicide layer 17 is formed on each of the conductive layers 16 in the contact portions 61 in such a manner, thereby reducing the contact resistance between each of the contact portions 61, and the first electrode (the connection electrodes 43 each connected to the first electrode 44 in this case) formed in the wiring layer 45.

Figure 7:
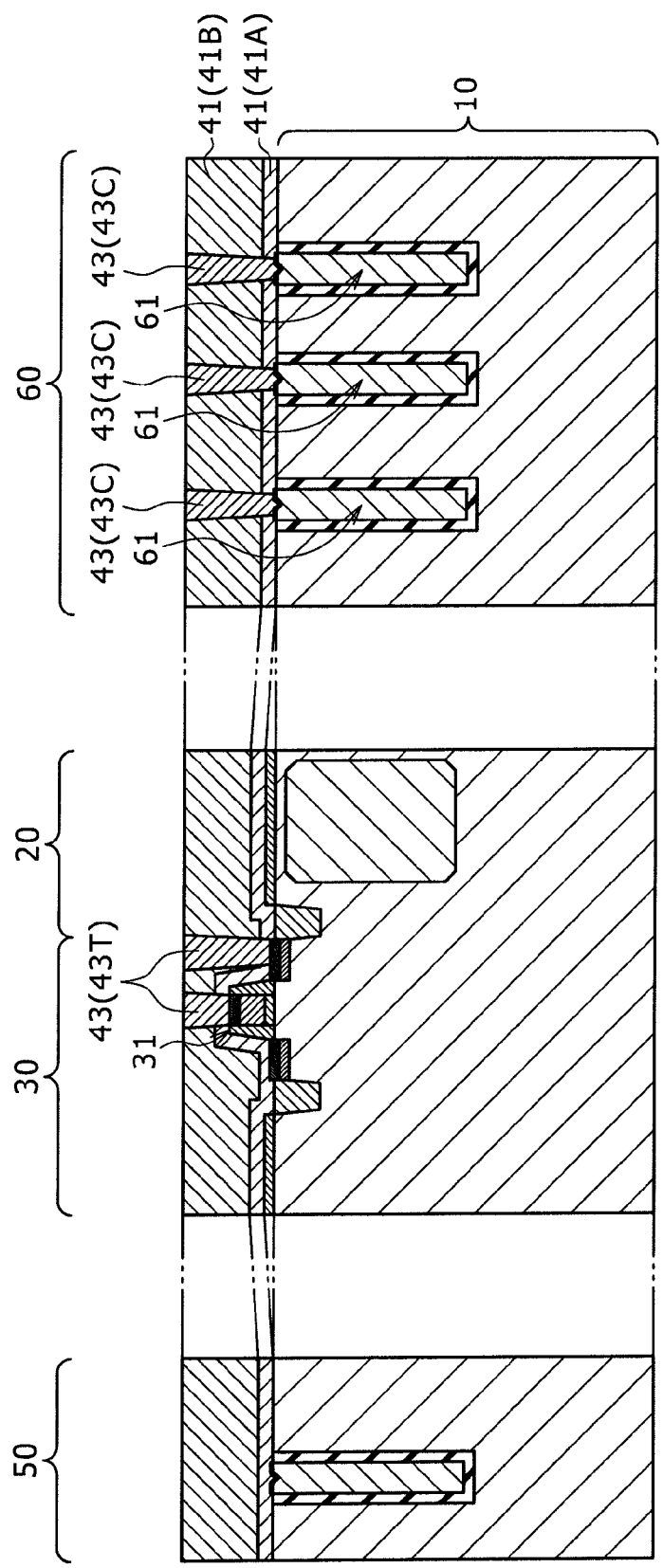
FIG. 7 is a schematic cross sectional view showing a process in the method of manufacturing the solid-state image pickup device shown in FIG. 1 according to the second embodiment of the present invention.

Next, as shown in FIG. 7, the first insulating film 41 (consisting of the lower layer 41A of the first insulating film 41, and the upper layer 41B of the first insulating film 41) becoming the etching stopping layer is formed on the silicon substrate 10. Also, the connection electrodes 43 (43C) are formed in the first insulating film 41 so as to be connected to the respective contact portions 61. At the same time, the connection electrodes 43 (43T) are formed so as to be each connected to the MOS transistor 31 in the peripheral circuit portion 30. Moreover, at the same time, although not illustrated, connection electrodes are also formed so as to be connected to the transistors of the pixel transistor portion, the floating diffusion and the like.

Figure 8:
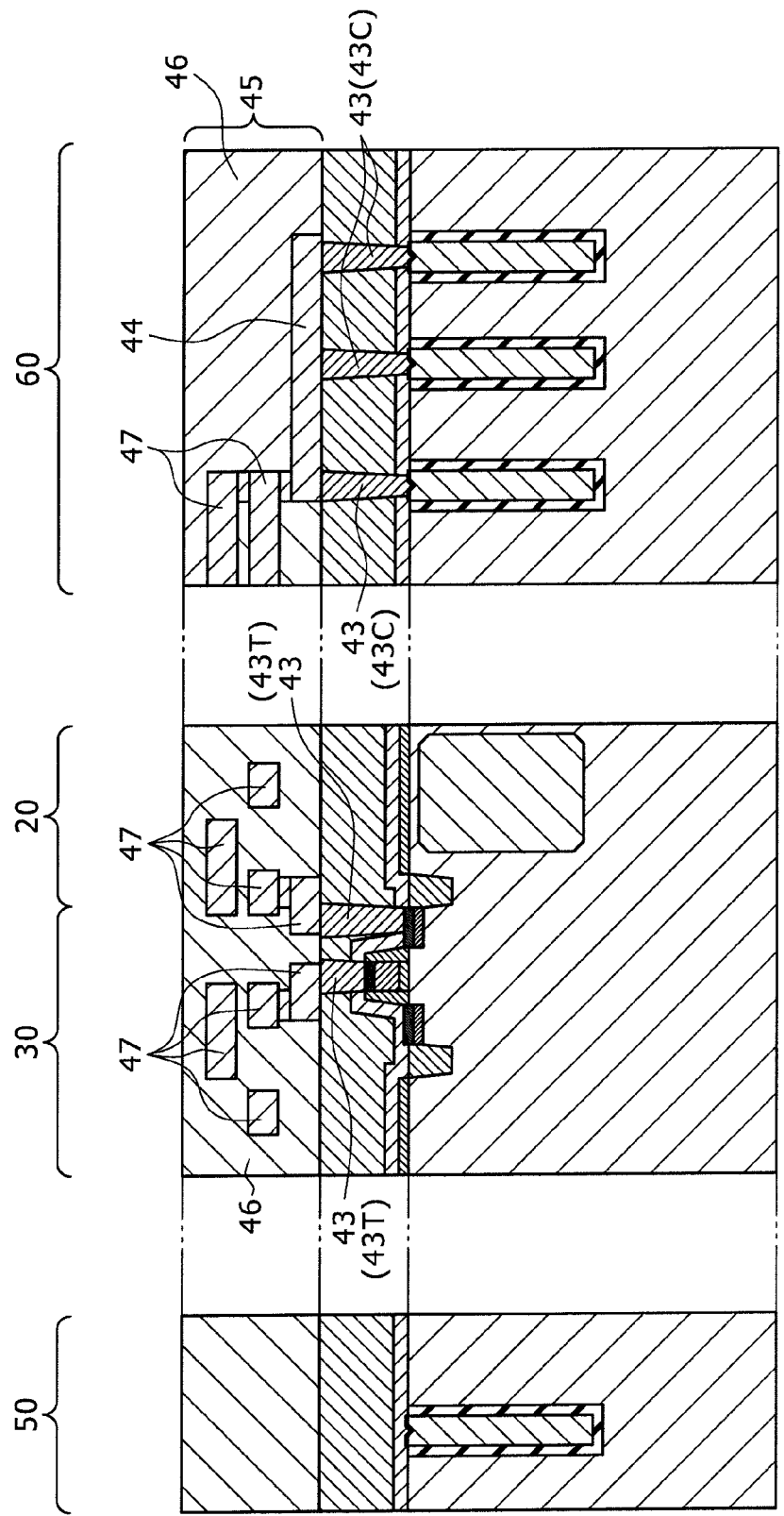
FIG. 8 is a schematic cross sectional view showing a process in the method of manufacturing the solid-state image pickup device shown in FIG. 1 according to the second embodiment of the present invention.

Next, as shown in FIG. 8, the wiring layer 45 including the first electrode 44, in the pad portion 60, connected to each of the connection electrodes 43C is formed on the first insulating film 41. Hereinafter, the first electrode 44 is defined so as to include the connection electrodes 43C described above. In the wiring layer 45, a plurality of wirings 47 (including the first electrode 44) are formed in the interlayer insulating film 46. Parts 47 of a plurality of wirings 47 are connected to the connection electrodes 43 (43T), respectively.

Figure 9:
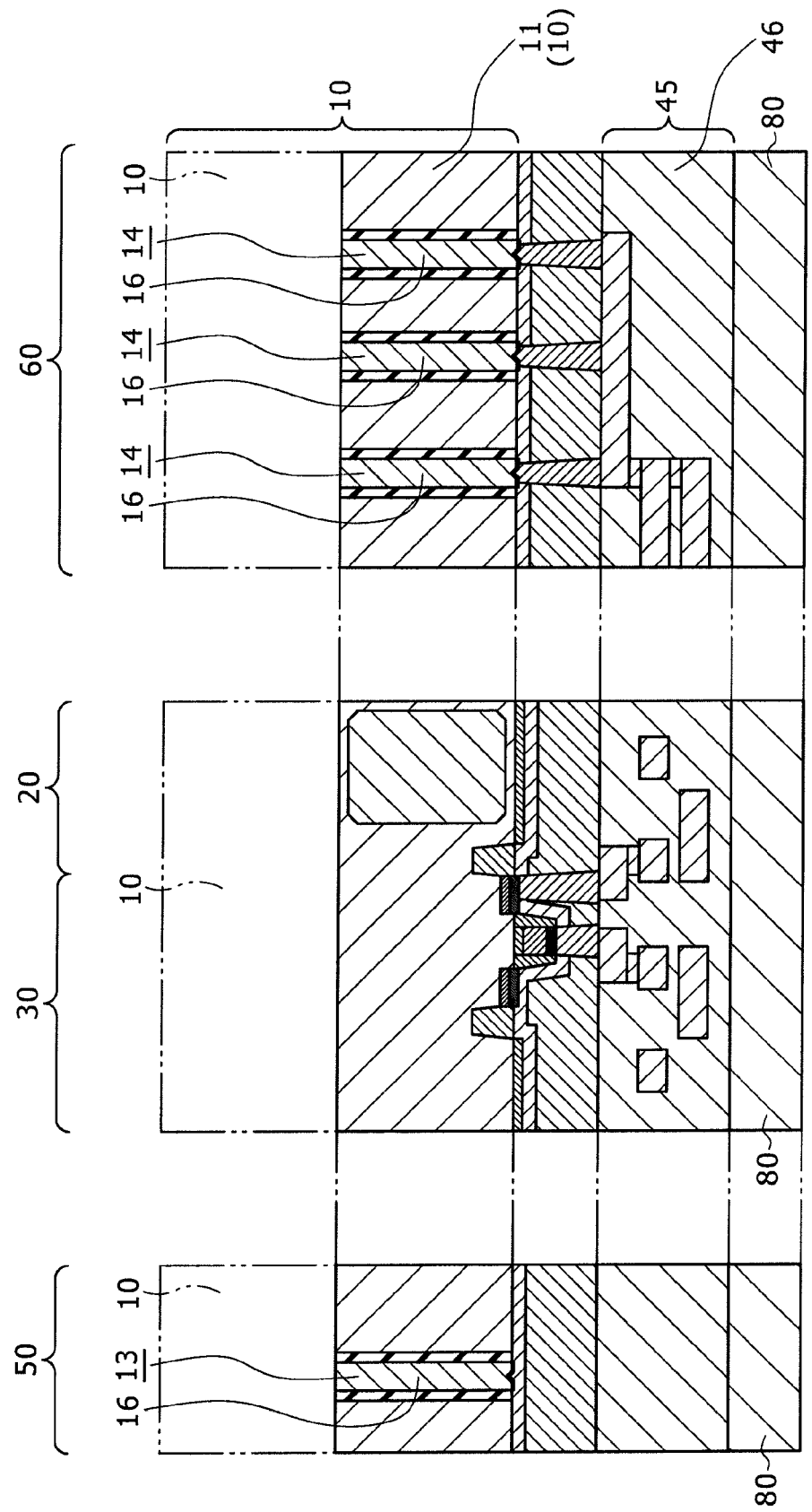
FIG. 9 is a schematic cross sectional view showing a process in the method of manufacturing the solid-state image pickup device shown in FIG. 1 according to the second embodiment of the present invention.

Next, as shown in FIG. 9, after the surface of the wiring layer 45 (the interlayer insulating film 46) is planarized, the supporting substrate 80 is stuck onto the surface of the wiring layer 45 thus planarized.

After that, a portion on the back surface side (a portion indicated by a two-dot chain line) of the silicon substrate 10 is removed to thin the silicon substrate 10, thereby forming the silicon layer 11. As a result, the conductive layer 16 formed inside each of the first hole 13 and the second holes 14 is exposed.

Figure 10:
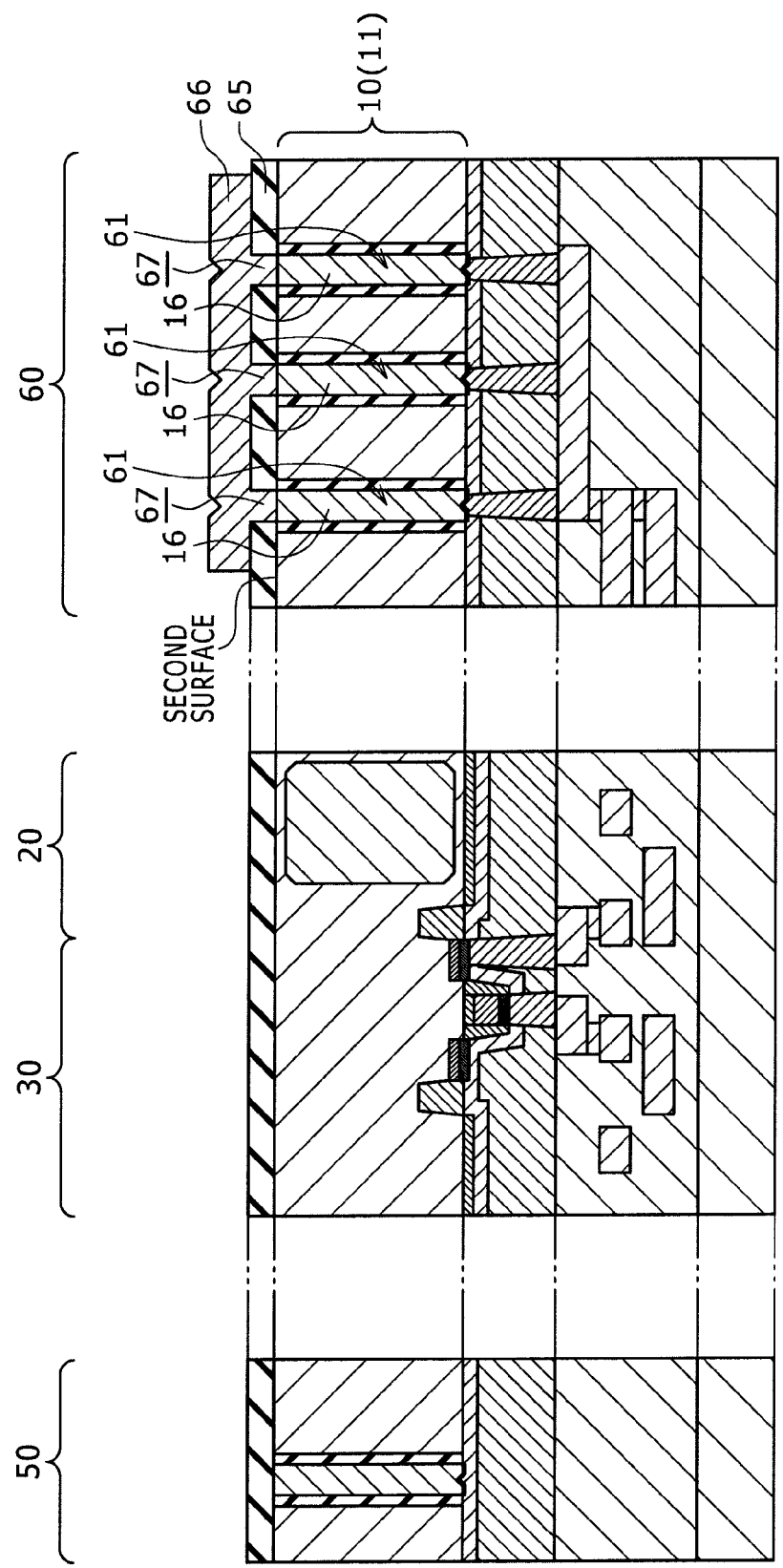
FIG. 10 is a schematic cross sectional view showing a process in the method of manufacturing the solid-state image pickup device shown in FIG. 1 according to the second embodiment of the present invention.

Next, as shown in FIG. 10, the second insulating film 65 is formed on the second surface (back surface) of the silicon substrate 10 (the silicon layer 11). Also, an etching mask is formed by utilizing the normal resist application technique and lithography technique, and the opening portions 67 are formed in the second insulating film 65 by using the etching mask so as to expose the conductive layers 16, respectively, in the pad portion 60. After that, the second electrode 66 in the pad portion 60 is formed so as to be connected to each of the conductive layers 16 through the respective opening portions 67. Here, the formation of the second electrode 66 is carried out by utilizing the normal wiring technique. For example, after a conductive film is formed, the conductive film is patterned by carrying out the suitable etching, thereby forming the second electrode 66.

Figure 11:
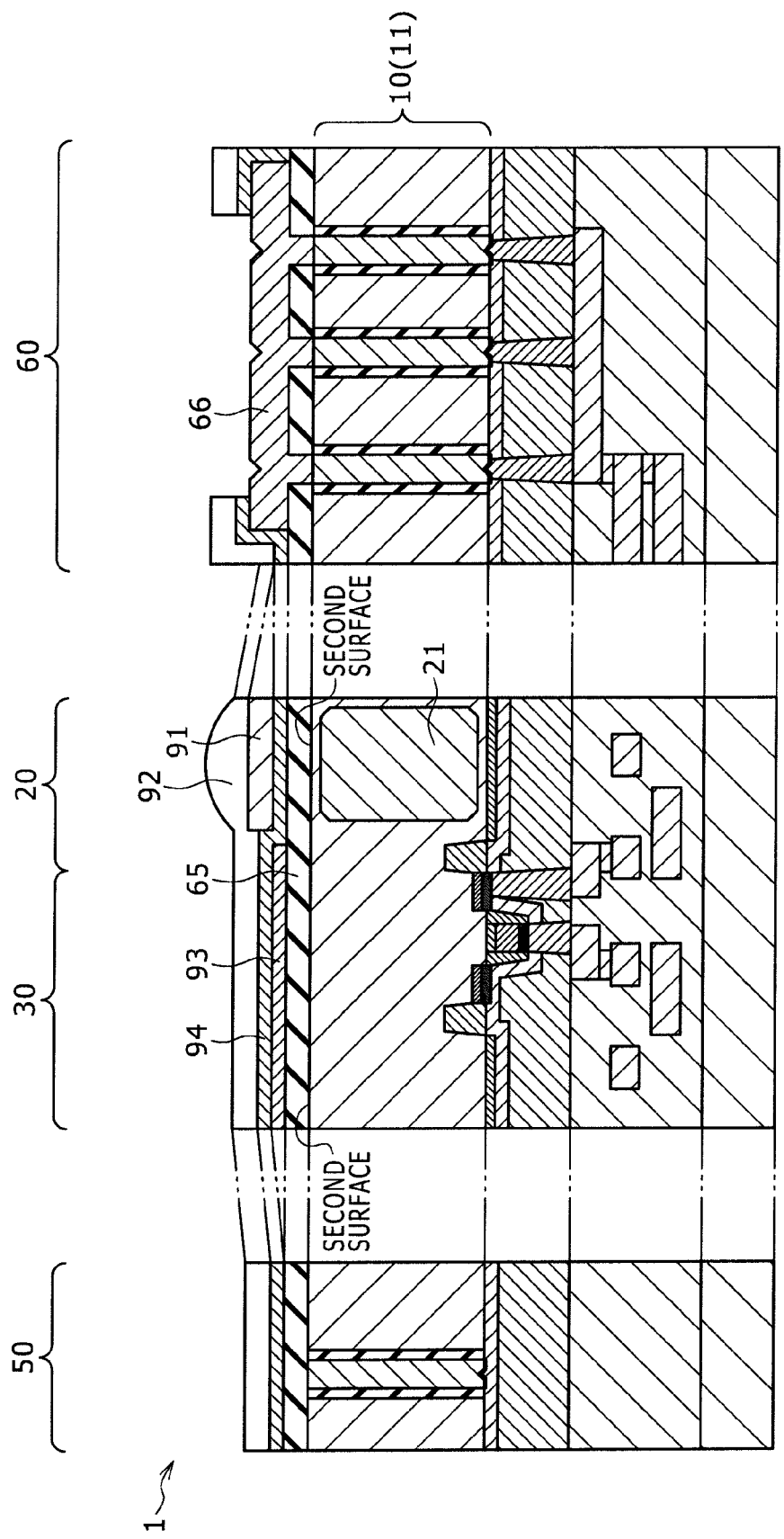
FIG. 11 is a schematic cross sectional view showing a process in the method of manufacturing the solid-state image pickup device shown in FIG. 1 according to the second embodiment of the present invention.

Next, as shown in FIG. 11, the color filter layer 91 is formed on the optical path of the incident light which is made incident to the light receiving portion 21 and on the second insulating film 65 on the second surface (back surface) side of the silicon substrate 10 (the silicon layer 11).

Moreover, the condenser lens 92 for guiding the incident light to the light receiving portion 21 is formed on the color filter 91. It is noted that the layer which is formed on the second electrode 66, and in which the color filter layer 91 and the condenser lens 92 are intended to be formed is removed, thereby exposing the surface of the second electrode 66 in advance.

In addition, prior to the formation of the color filter layer 91, the light blocking film 93 may be formed on the second insulating film 65 in the peripheral circuit portion 30. In this case, the insulating film 94 is formed so as to cover the light blocking film 93. Therefore, the color filter 92 is formed on the insulating film 94.

The manufacture of the solid-state image pickup device 1 is completed in the manner described above.

With the method of manufacturing the solid-state image pickup device 1, it is unnecessary to form the opening portion extending completely through the silicon layer 11 in order to expose the first electrode 44 for the pad as with the related art because the second electrode 66 in the pad portion 60 is formed on the second surface side (light incidence side) of the silicon layer 11. In addition, the contact portion 61 formed in the position where the existing opening portion is intended to be formed can be formed with a smaller occupation area than that of the existing opening portion because all it takes is that the electrical connection between the first electrode 44 and the second electrode 66 in the pad portion 60 is obtained. In addition, the alignment mark 50 and the contact portions 61 are formed from the respective conductive layers 16 made of the same conductive material and within the holes for formation of the alignment mark 50 and the contact portion 61 through the insulating layers 15, made of the same material, respectively, in the same process. As a result, the processes for forming the alignment mark 50 and the contact portion 61 are simplified.

Therefore, the number of processes can be reduced because the alignment mark 50 and the contact portions 61 are formed in the same process. As a result, there is obtained an effect that the manufacturing processes can be simplified, and the manufacture cost can be reduced so as to be associated therewith.

Change of Second Embodiment

Next, a method of manufacturing a solid-state image pickup device according to a change of the second embodiment will be described.

The method of manufacturing a solid-state image pickup device according to the change of the second embodiment is such that in the method of manufacturing the solid-state image pickup device 1 described with reference to FIGS. 2 to 11, each of the conductive layers 16 is made of a metal, and the silicide layer is formed on none of the surfaces of the conductive layers 16. Copper (Cu), aluminum (Al), tungsten (W), titanium (Ti), tantalum (Ta) or the like, for example, can be used as this metal. In addition, an alloy thereof can also be used as this metal. Moreover, the manufacturing processes other than making each of the conductive layers 16 of the metal, and forming the silicide layer on none of the surfaces of the conductive layers 16 are identical to the method of manufacturing the solid-state image pickup device 1 of the second embodiment.

Each of the conductive layers 16 is made of the metal in such a manner, thereby making it possible to further reduce the contact resistance between the first electrode 44 (substantially, each of the connection electrodes 43) and each of the conductive layers 16.

Comparative Example

Next, a comparative example of a method of manufacturing a solid-state image pickup device will be described with reference to schematic cross sectional views explaining respective manufacturing processes shown in FIGS. 12 to 22. It is noted that a standpoint of FIGS. 12 to 22 is reverse to that of FIG. 1.

Figure 12:
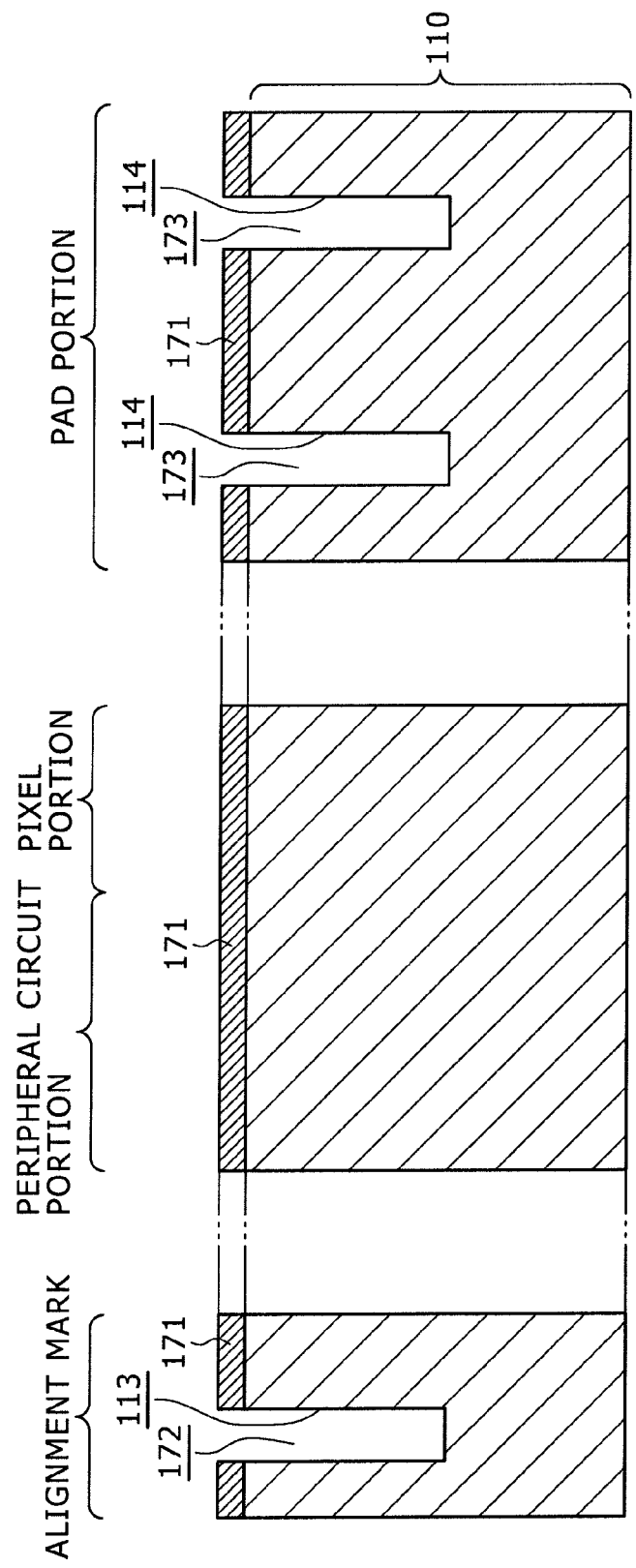
FIG. 12 is a schematic cross sectional view showing a process in a method of manufacturing a solid-state image pickup device according to a comparative example.

Firstly, as shown in FIG. 12, a silicon nitride film 171 is formed on a surface (first surface) of a silicon substrate 110 through a silicon oxide film (not shown).

Next, an opening portion 172, and opening portions 173 are formed in the silicon nitride film 171 in a region in which an alignment mark is intended to be formed, and in a region in which contact portions in a pad portion are intended to be formed, respectively, by utilizing the etching technique using a resist mask (not shown). After that, the resist mask is removed.

Next, a first hole 113 in which the alignment mark is intended to be formed, and second holes 114 formed in a pad formation region are formed in the silicon substrate 110 by using the silicon nitride film 171 as an etching mask. Each of the second holes 114 is formed so as to surround a side portion of an opening portion which will be formed for extraction of an electrode for a pad in the later process. That is to say, each of the second holes 114 is formed to have a ring-like hole in a planar view.

Figure 13:
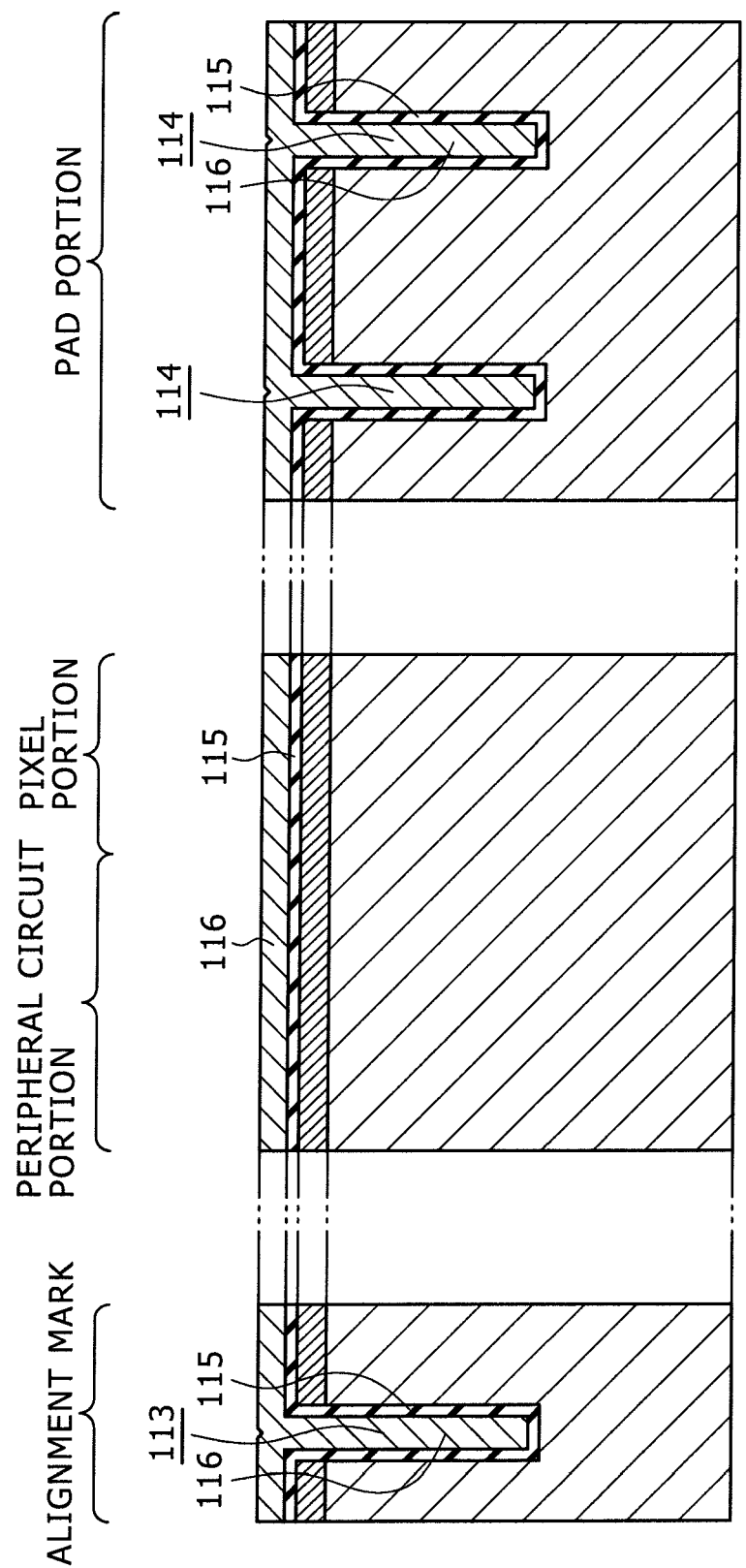
FIG. 13 is a schematic cross sectional view showing a process in the method of manufacturing the solid-state image pickup device according to the comparative example.

Next, as shown in FIG. 13, polycrystalline silicon (polysilicon) is filled in each of the first hole 113 and the second holes 114 through an insulating layer 115, thereby forming a filled layer 116. Alternatively, an amorphous silicon layer may be used instead of using the polysilicon layer.

Figure 14:
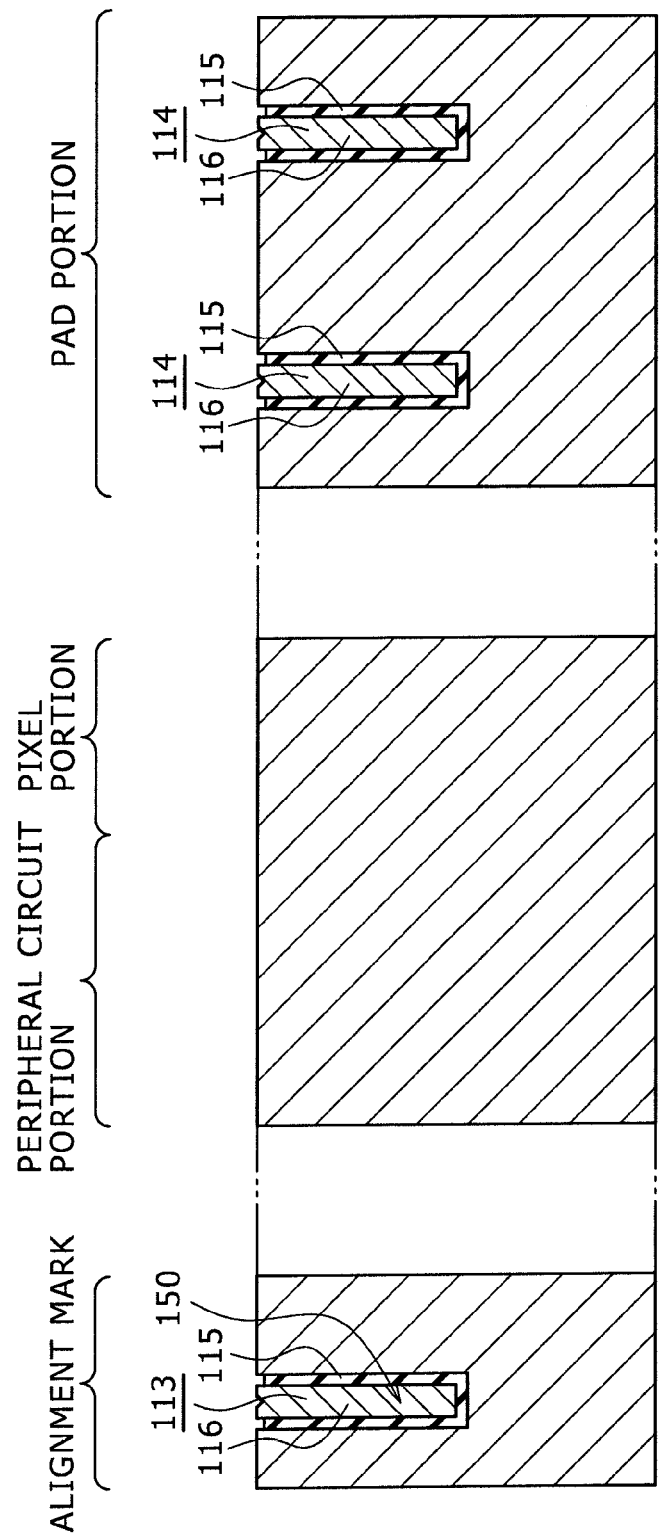
FIG. 14 is a schematic cross sectional view showing a process in the method of manufacturing the solid-state image pickup device according to the comparative example.

Next, as shown in FIG. 14, the excessive polysilicon layer 116 and insulating layer 115 (refer to FIG. 13) lying on the silicon nitride film 171 (refer to FIG. 12) are removed away. As a result, an alignment mark 150 is formed which is obtained by filling the polysilicon layer 116 in the first hole 113 through the insulating layer 115. At the same time, the filled layer 116 is filled in each of the second holes 114 through the insulating layer 115.

The removal of the filled layer 116 and the insulating layer 115 is made by carrying out the etch back. Of course, the removal of the filled layer 116 and the insulating layer 115 may be made by utilizing the CMP method.

It should be noted that it is no problem that stepped portions are caused in the surfaces of the alignment mark 150 and each of surfaces of the filled layers 116 filled in the respective second holes 114.

After that, the silicon nitride film 171 is removed. FIG. 14 shows a state after removal of the silicon nitride film 171.

Figure 15:
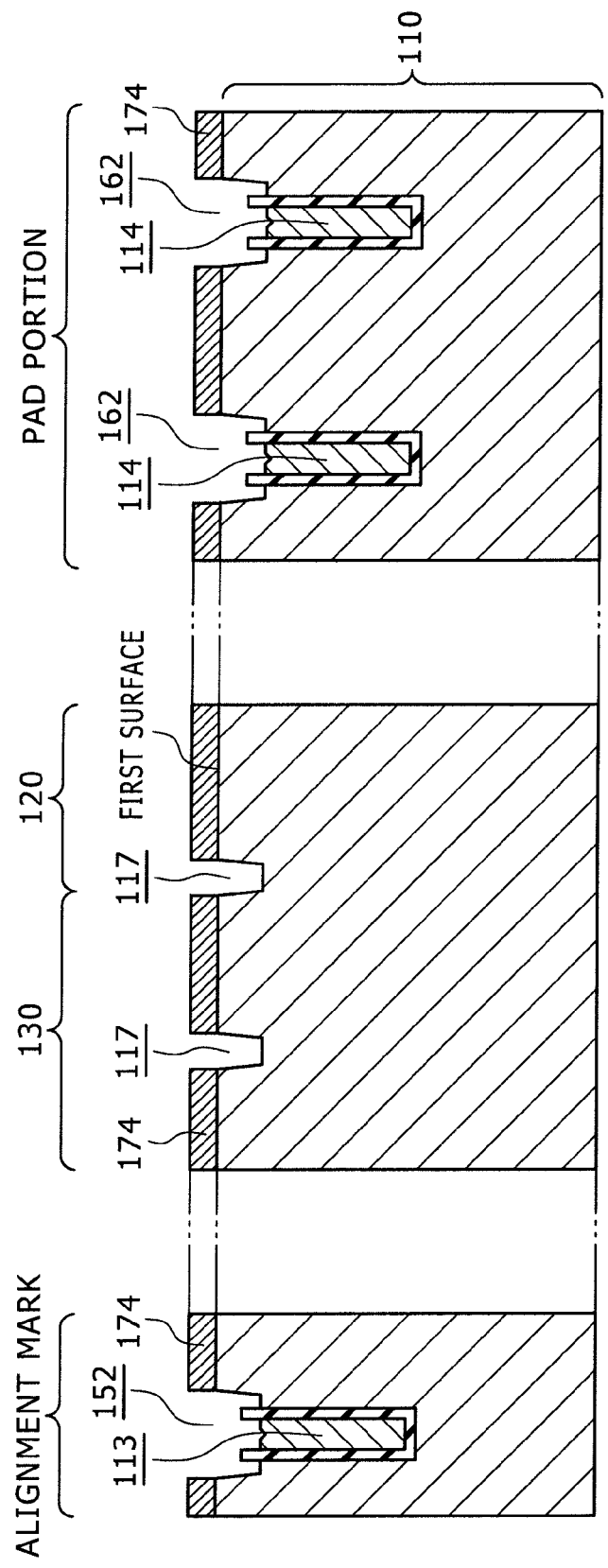
FIG. 15 is a schematic cross sectional view showing a process in the method of manufacturing the solid-state image pickup device according to the comparative example.

Next, as shown in FIG. 15, an isolation trench 117 through which a pixel portion 120 for photoelectrically converting an incident light and outputting signal charges corresponding to the incident light, and a region for formation of a peripheral circuit portion 130 for processing the signal charges thus outputted are isolated from each other is formed in the silicon substrate 110.

For formation of the isolation trench 117, firstly, a silicon nitride film 174 is formed on a first surface (surface) of the silicon substrate 110 through a silicon oxide film (not shown).

Next, an opening portion is provided in a predetermined position of the silicon nitride film 174. Also, the silicon nitride film 174 is selectively etched away by using an etching mask, thereby forming the isolation trench 117 in the silicon substrate 110. At this time, a trench 152, and trenches 162 are formed on an upper portion as well of the first hole 113 in the formation region of the alignment mark, and on upper portion sides as well of the second holes 114 in the formation region of the pad portion, respectively.

Figure 16:
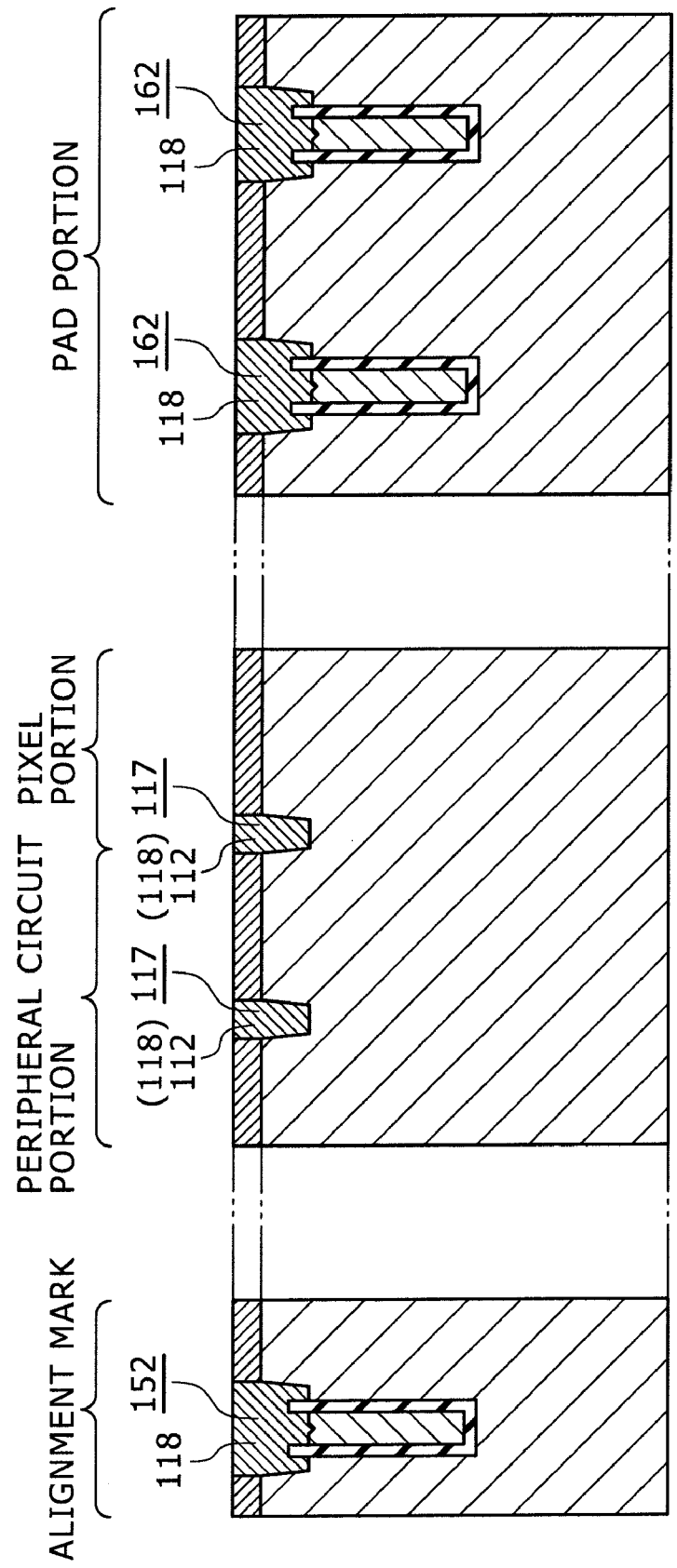
FIG. 16 is a schematic cross sectional view showing a process in the method of manufacturing the solid-state image pickup device according to the comparative example.

Next, as shown in FIG. 16, an insulating film 118 is filled in each of the isolation trench 117, and the trench 152 and the trenches 162, and the excessive insulating film 118 lying on the silicon nitride film 174 is removed away by, for example, utilizing the CMP method. It is noted that before the filling of the insulating film 118, each of inner surfaces of the isolation trench 117, and the trench 152 and the trenches 162 may be oxidized to form thereon an oxide film. In such a manner, an isolation region 112 is formed inside the isolation trench 117.

It is noted that FIG. 16 shows a state after the excessive insulating film 118 formed on the silicon nitride film 174 is removed away.

Figure 17:
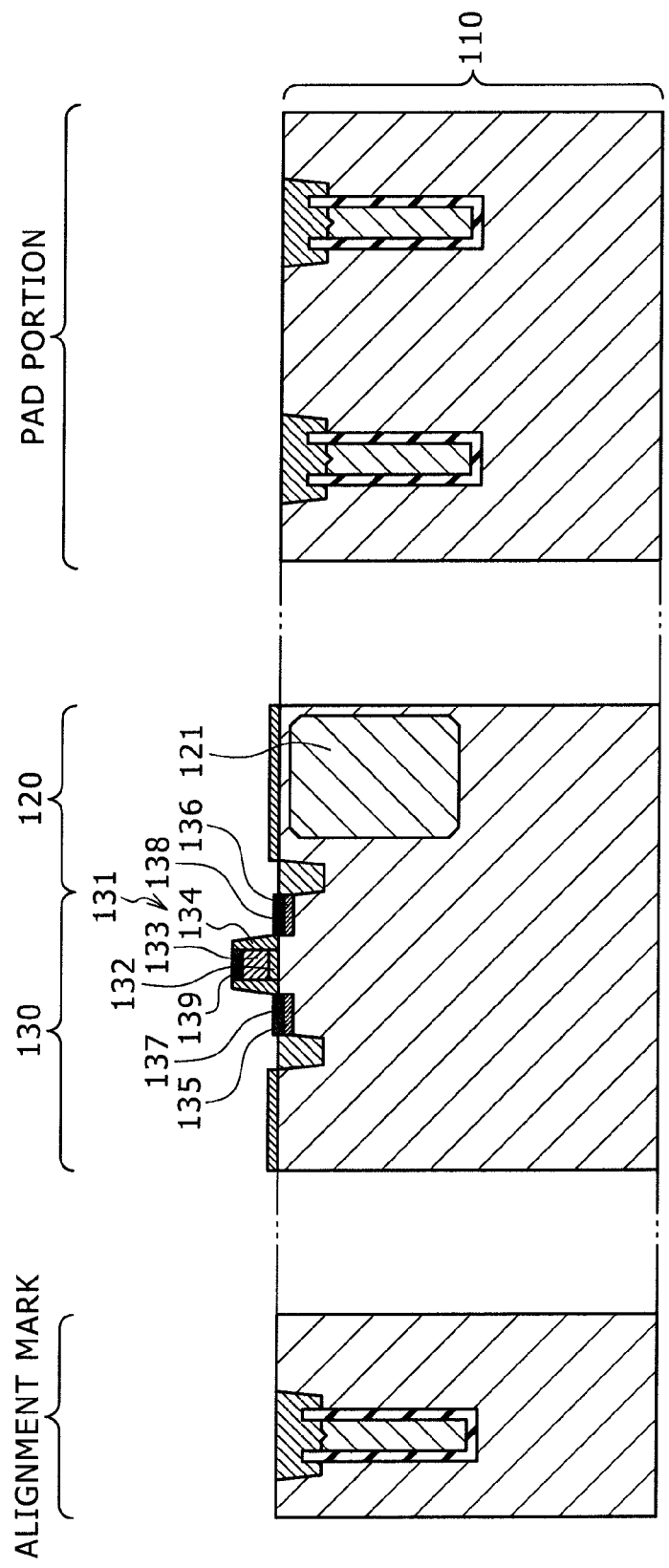
FIG. 17 is a schematic cross sectional view showing a process in the method of manufacturing the solid-state image pickup device according to the comparative example.

Next, as shown in FIG. 17, a light receiving portion 121 for photoelectrically converting the incident light into the signal charges is formed in the silicon substrate 110. In addition, the pixel transistor portion (not shown) for outputting the signal charges obtained through the photoelectric conversion in the light receiving portion 121 is formed in the silicon substrate 110. Moreover, a transistor 131 in a peripheral circuit portion 130 is formed in the periphery of a pixel portion 120 having the light receiving portion 121 and the pixel transistor portion described above formed therein.

The light receiving portion 121, the transistor (not shown) in the pixel transistor portion, and the transistor 131 in the peripheral circuit portion 130 are formed in the same processes as those described above in the method of manufacturing the solid-state image pickup device 1 according to the second embodiment of the present invention. For example, a gate electrode 133 is formed on the silicon substrate 110 through a gate insulating film 132, and a sidewall 134 is formed on a sidewall of the gate electrode 133. Next, source and drain regions 135 and 136 are formed in the silicon substrate 110 on both sides of the gate electrode 133.

Next, silicide layers 137, 138 and 139 are formed on the source and drain regions 135 and 136, and the gate electrode 133 of each of the MOS transistors in the peripheral circuit portion 130, respectively. In FIG. 17, one transistor 131 is shown on behalf of a plurality of MOS transistor.

The silicide layers 137, 138 and 139 are formed in the same processes as those described above in the method of manufacturing the solid-state image pickup device 1 according to the second embodiment of the present invention.

Figure 18:
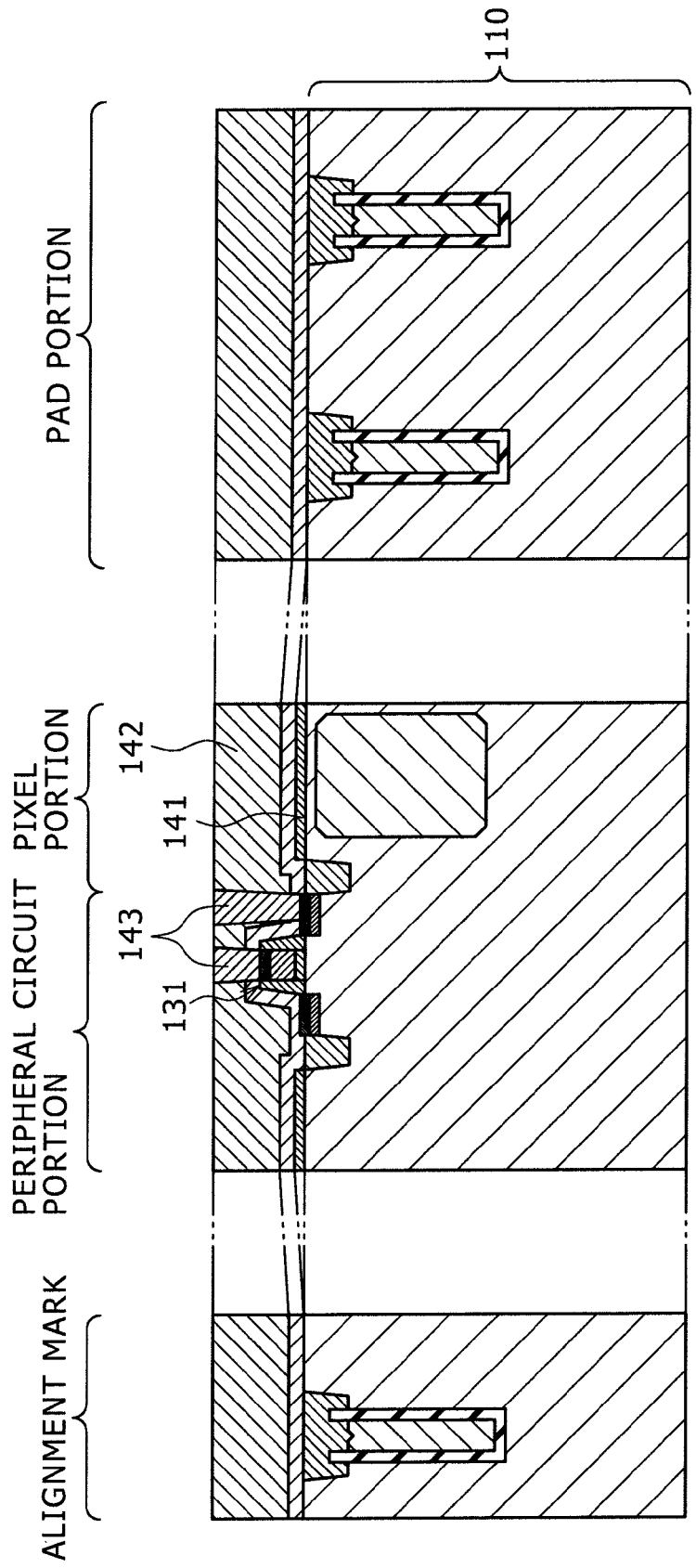
FIG. 18 is a schematic cross sectional view showing a process in the method of manufacturing the solid-state image pickup device according to the comparative example.

Next, as shown in FIG. 18, an etching stopping film 141 and a first insulating film 142 are formed in this order on the silicon substrate 110, and connection electrodes 143 are formed in the first insulating film 142 so as to be connected to the transistor 131 in the peripheral circuit portion 130. At the same time, although not illustrated, connection electrodes are also formed so as to be connected to the transistors, the floating diffusion portion and the like of the pixel transistor portion.

Figure 19:
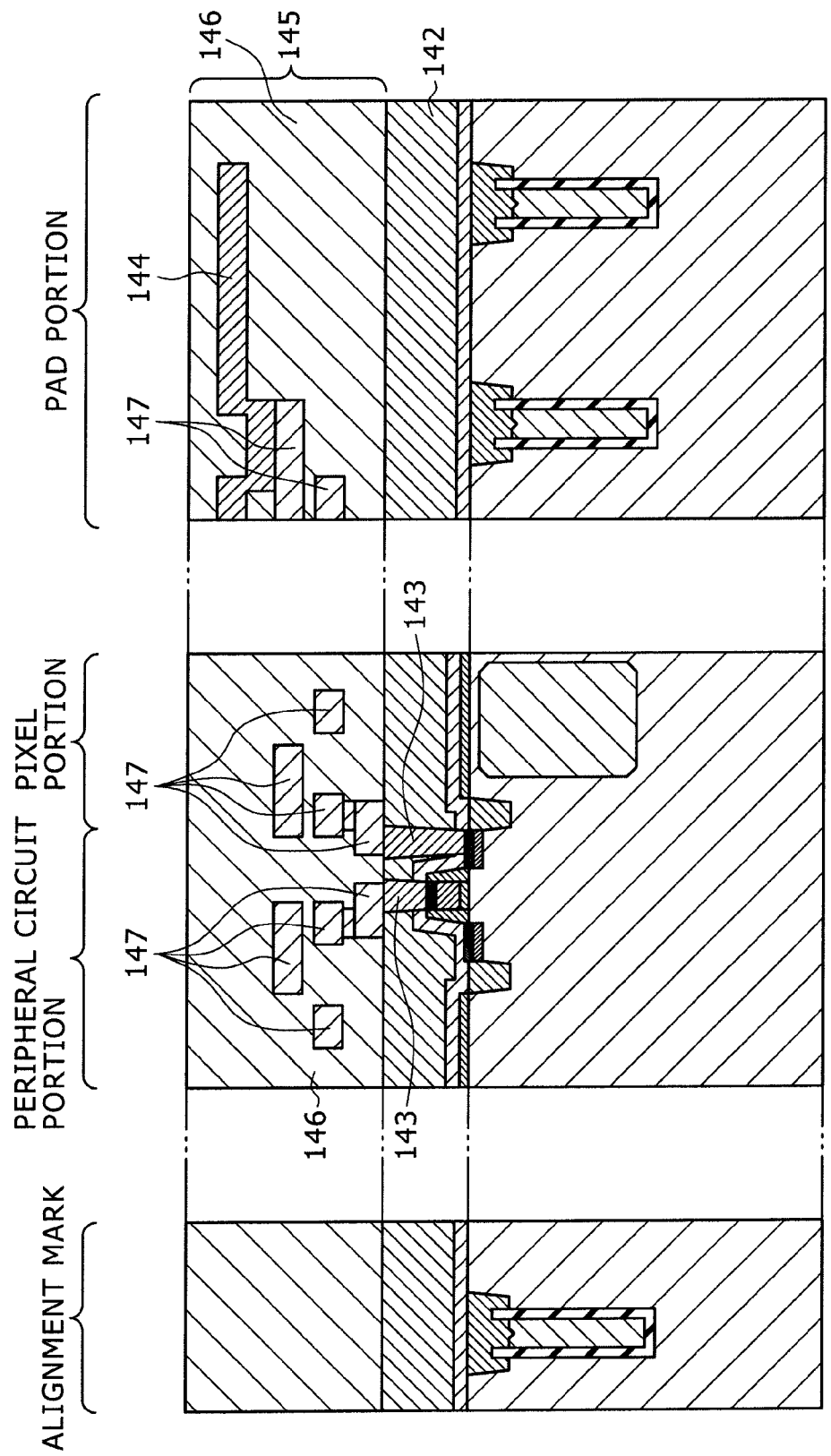
FIG. 19 is a schematic cross sectional view showing a process in the method of manufacturing the solid-state image pickup device according to the comparative example.

Next, as shown in FIG. 19, wiring layers 147 connected to the respective connection electrodes 143, and a wiring layer 145 including a first electrode 144 in the pad portion are formed on the first insulating film 142. In the wiring layer 145, a plurality layer of wirings 147 including wirings 147 connected to the respective connection electrodes 143, and the first electrode 144 are formed in the interlayer insulating film 146.

Figure 20:
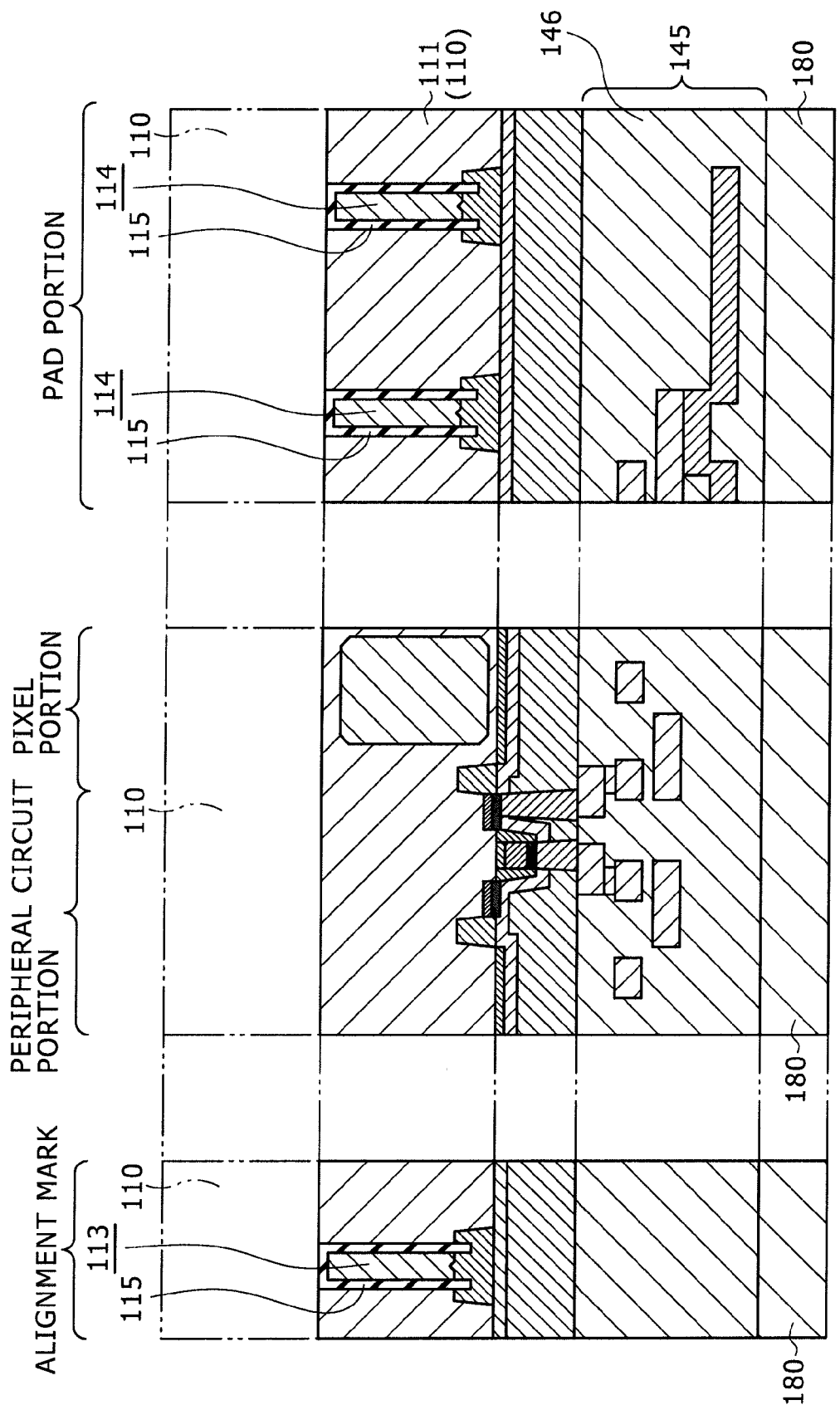
FIG. 20 is a schematic cross sectional view showing a process in the method of manufacturing the solid-state image pickup device according to the comparative example.

Next, as shown in FIG. 20, after a surface of the wiring layer 145 (the interlayer insulating film 146) is planarized, a supporting substrate 180 is stuck onto the surface of the wiring layer 145 thus planarized.

After that, a portion on the back surface side (a portion indicated by a two-dot chain line) of the silicon substrate 110 is removed away to thin the silicon substrate 110, thereby forming a silicon layer 111. As a result, the insulating layers 115 formed inside each of the first hole 113 and the second holes 114 is exposed.

Figure 21:
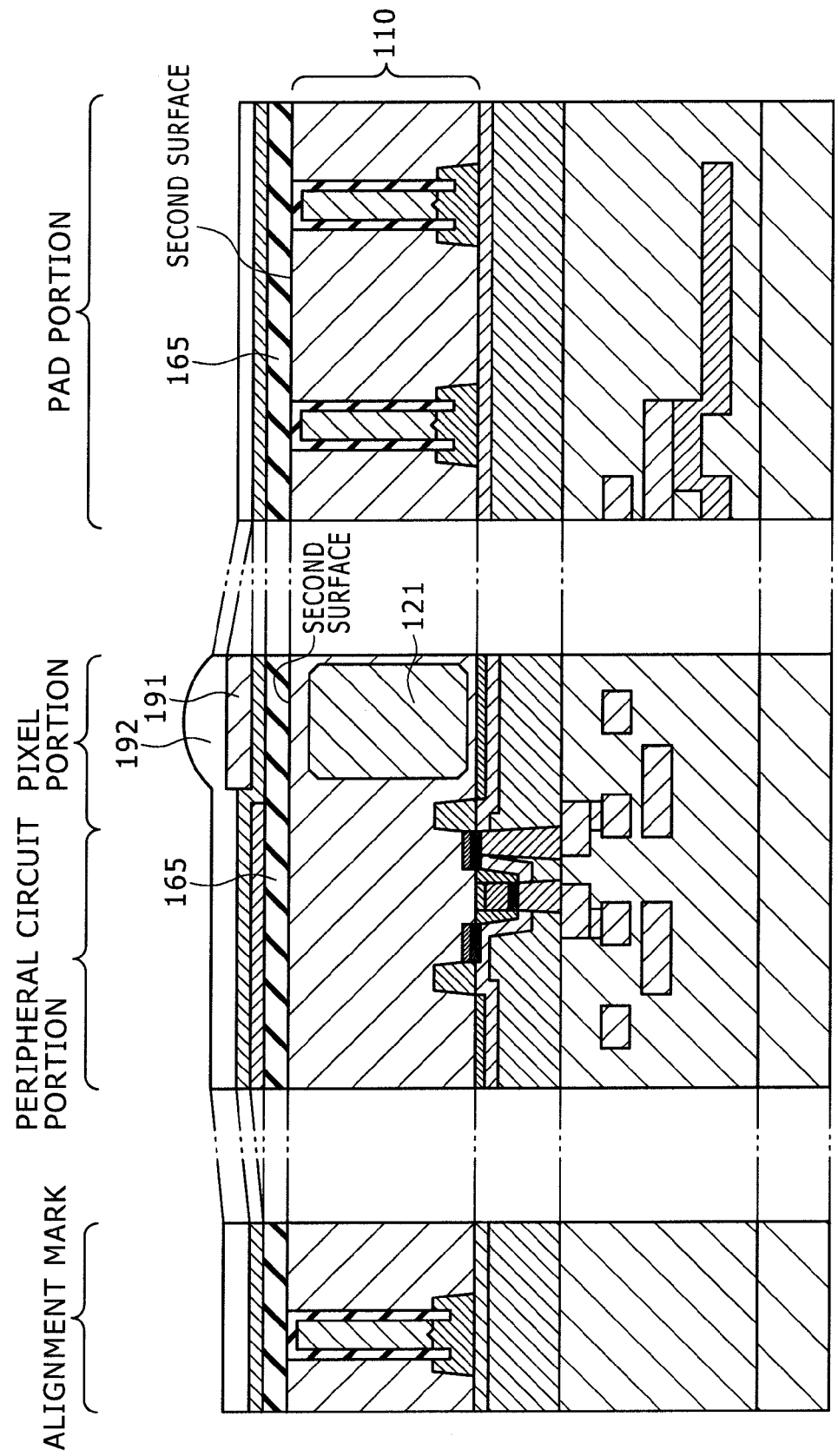
FIG. 21 is a schematic cross sectional view showing a process in the method of manufacturing the solid-state image pickup device according to the comparative example.

Next, as shown in FIG. 21, a color filter layer 191 is formed on an optical path of the incident light which is made incident to the light receiving portion 121 and on a second surface (back surface) of the silicon substrate 110 (the silicon layer 111) through the second insulating film 165.

Moreover, a condenser lens 192 for guiding the incident light to the light receiving portion 121 is formed on the color filter 191.

Figure 22:
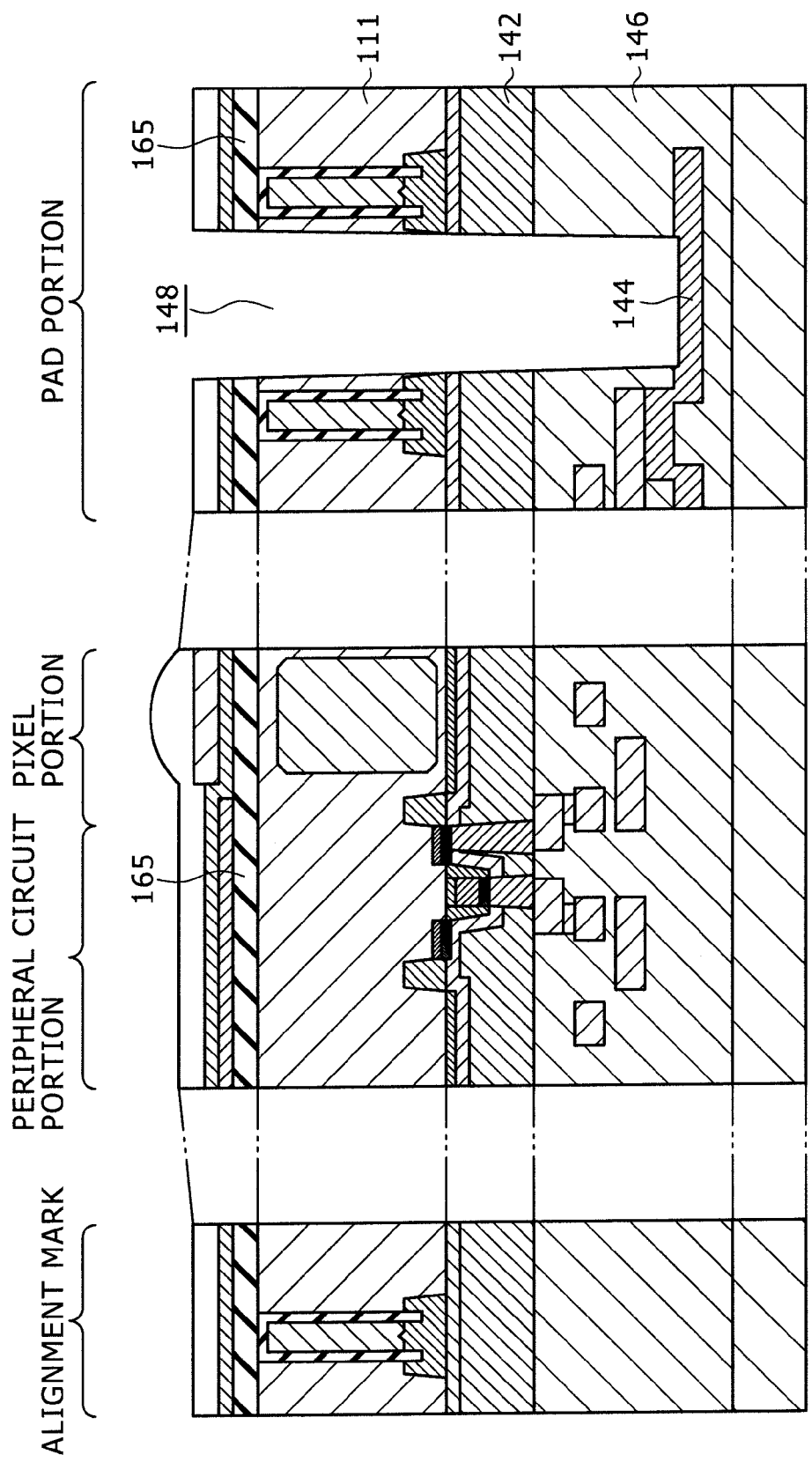
FIG. 22 is a schematic cross sectional view showing a process in the method of manufacturing the solid-state image pickup device according to the comparative example.

Next, as shown in FIG. 22, a part of the interlayer insulating film 146 is opened so as to extend completely through the second insulating film 165, the silicon layer 111, the etching stopping film 141, the first insulating film 142, and the like from the side of the second insulating film 165, thereby forming an opening portion 148 reaching the first electrode 144.

As described above, it is understood that with the related art relating to the manufacturing method described above, it is necessary to form the opening portion 148 reaching the first electrode 144 in the pad portion, and thus the number of manufacturing processes is larger the number of processes for forming the opening portion 148 than that in the manufacturing method according to the second embodiment of the present invention. In addition, with the manufacturing method according to the second embodiment of the present invention, since as previously stated, the alignment mark 50 and each of the contact portions 61 are simultaneously formed, the process for forming the contact portions 61 needs not to be specially carried out in addition to the process for forming the alignment mark 50. In addition, there is also an advantage that a load necessary for carrying out a new process is less in terms of the process because the manufacturing processes in the related art can be substantially converted, thereby carrying out the manufacturing method according to the second embodiment of the present invention. That is to say, the manufacturing method according to the second embodiment of the present invention can be carried out by using the existing manufacturing systems used in the related art. To this end, the manufacture cost can be reduced all the more because there is no increase in manufacture cost and equipment cost, and it is unnecessary to form the opening portion 148.

Application Example of Solid-State Image Pickup Device

An example of a configuration of an image pickup apparatus to which the solid-state image pickup device according to the first embodiment of the present invention is applied will be described below with reference to a schematic block diagram shown in FIG. 23.

Figure 23:
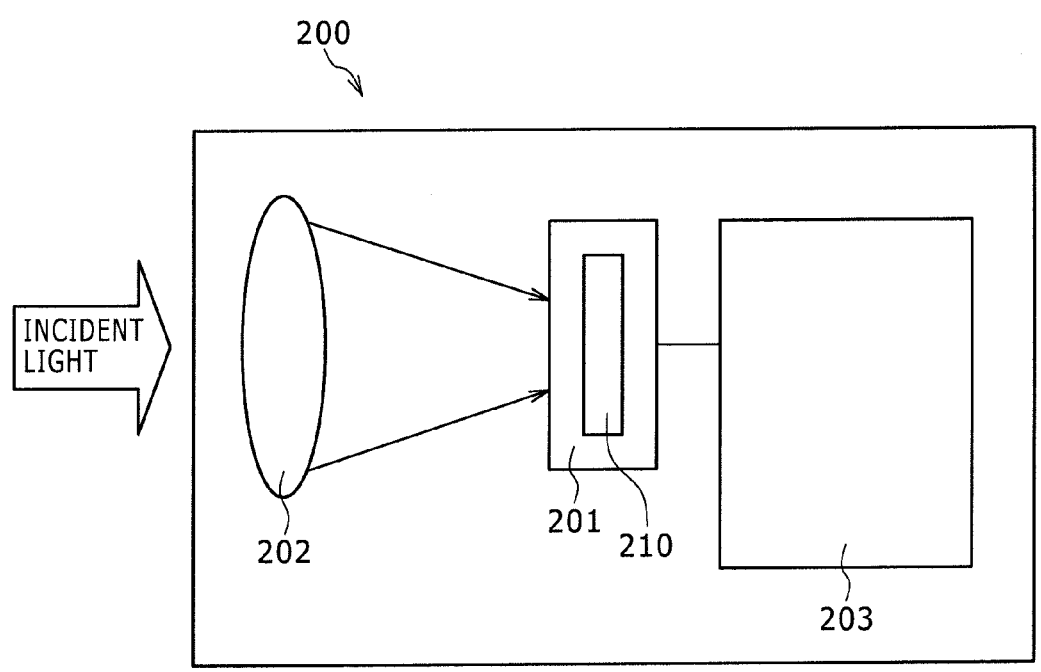
FIG. 23 is a schematic block diagram showing a configuration of an image pickup apparatus to which the solid-state image pickup device according to the first embodiment of the present invention is applied.
Figure 24:
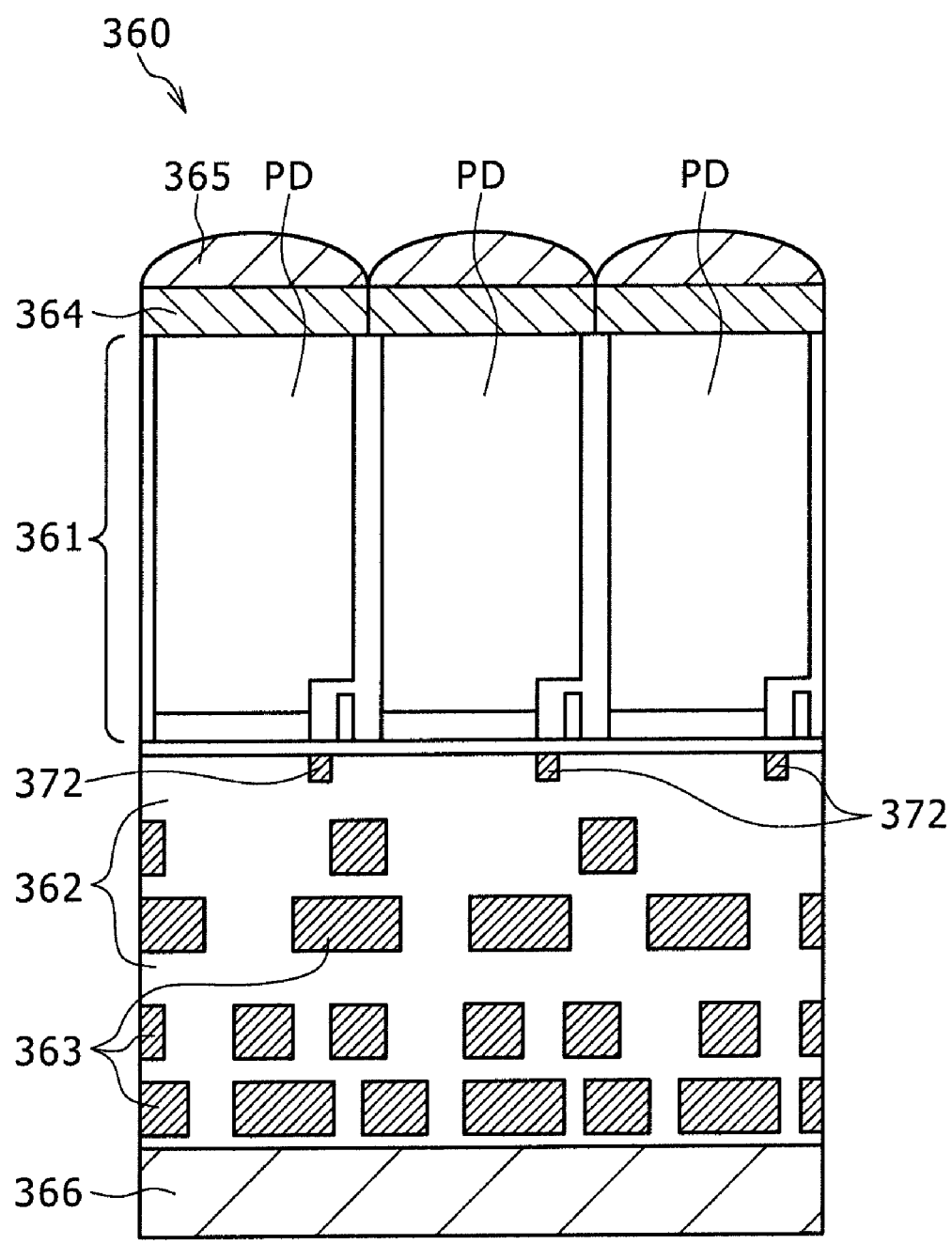
FIG. 24 is a schematic cross sectional view showing a method of manufacturing a solid-state image pickup device according to a related art.

As shown in FIG. 23, an image pickup apparatus 200 includes a solid-state image pickup device 210 in an image pickup portion 201. A condensing optical portion 202 for imaging an image is provided on a condensing side of the image pickup portion 201. In addition, a signal processing portion 203 having a drive circuit for driving the image pickup portion 201, a signal processing circuit for processing a signal obtained through the photoelectric conversion in the image pickup device 210 into an image signal, and the like are connected to a subsequent stage of the image pickup portion 201. In addition, the image signal obtained through the processing executed in the signal processing portion 203 can be stored in an image storage portion (not shown). In such an image pickup apparatus 200, the solid-state image pickup device 1 of the first embodiment previously described with reference to FIG. 1 can be used as the solid-state image pickup device 210.

According to the image pickup apparatus 200 of the application example, there is an advantage that an image which is excellent in color reproducibility is obtained because an image synthesis margin when an image is adjusted so as to have color near the nature can be obtained, and color correction can be readily carried out since a proper spectroscopic balance of the solid-state image pickup device 1 can be produced.

In addition, the image pickup apparatus 200 either may have a form which is formed as one chip or may also have a module-like form which has an image pickup function, and into which the image pickup portion, and either the signal processing portion or the optical system are collectively packaged. Also, the image pickup apparatus 200 can be applied to the image pickup apparatus as described above. Here, the image pickup apparatus, for example, means a camera or a mobile apparatus having an image pickup function. In addition, the wording "the image pickup" includes not only the capturing of an image in a phase of the normal camera photographing, but also fingerprint detection or the like in the wide sense.

The present application contains subject matter related to that disclosed in Japanese Priority Patent Application JP 2009-057485 filed in the Japan Patent Office on Mar. 11, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a solid-state image pickup device, comprising:
    forming a first hole in which an alignment mark is to be formed, and a second hole in which a contact portion for a pad is to be formed;
    filling a conductive material in each of said first hole and said second hole with an insulating material between the conductive material and the silicon substrate, thereby forming said alignment mark and said contact portion in said first hole and said second hole, respectively;
    forming a light converting portion, in a pixel portion, for photoelectrically converting an incident light to output signal charges corresponding to the incident light, a transistor, in said pixel portion, for reading out the signal charges from said light receiving portion and outputting a signal corresponding to the signal charges, and a transistor, in a peripheral circuit portion, for processing the signal output from said pixel portion in said silicon substrate;
    forming a first insulating film on said first surface of the silicon substrate, and forming a connection electrode so as to be connected to said contact portion on said first insulating film;
    forming a wiring layer so as to include a first electrode, in a pad portion, connected to said connection electrode on said first insulating film;
    removing a second surface side opposite to the first surface side of said silicon substrate until said contact portion is exposed, and forming a second insulating film on an exposed surface of the remaining silicon substrate; and
    forming a second electrode, in said pad portion, so as to be connected to said conductive layer in said second insulating film on the second surface side of said silicon substrate.

2. The method of manufacturing a solid-state image pickup device according to claim 1, wherein
    a silicide layer is formed on each of source and drain regions of said transistor in said peripheral circuit portion and at a same time, a silicide layer is formed on a surface of said conductive layer.

3. The method of manufacturing a solid-state image pickup device according to claim 1, further comprising:
    forming a color filter layer at an optical path of the incident light made incident to said light receiving portion and on said second insulating film; and
    forming a condenser lens for guiding the incident light to said light receiving portion on said color filter layer.

* * * * *